United States Patent
Kim et al.

(10) Patent No.: US 12,225,802 B2
(45) Date of Patent: Feb. 11, 2025

(54) TOUCH SENSING UNIT INTEGRATED DISPLAY DEVICE INCLUDING OUTGASSING HOLES

(71) Applicant: Samsung Display Co., Ltd., Yongin-si (KR)

(72) Inventors: Se-ho Kim, Cheonan-si (KR); Wonkyu Kwak, Seongnam-si (KR); Ji-eun Lee, Seoul (KR); Yohan Kim, Seoul (KR); Dong-seop Park, Pyeongtaek-si (KR); Kwangsik Lee, Cheonan-si (KR); Jaesun Lee, Cheonan-si (KR); Sungho Cho, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/414,415

(22) Filed: Jan. 16, 2024

(65) Prior Publication Data
US 2024/0244919 A1    Jul. 18, 2024

Related U.S. Application Data

(62) Division of application No. 17/970,497, filed on Oct. 20, 2022, now Pat. No. 11,974,488, which is a (Continued)

(30) Foreign Application Priority Data

Jul. 29, 2016    (KR) ........................ 10-2016-0097503

(51) Int. Cl.
*H10K 59/40*    (2023.01)
*G06F 3/041*    (2006.01)
(Continued)

(52) U.S. Cl.
CPC ........... *H10K 59/40* (2023.02); *G06F 3/0412* (2013.01); *G06F 3/0443* (2019.05);
(Continued)

(58) Field of Classification Search
CPC .. H10K 50/805; H10K 50/84; H10K 50/8426; H10K 59/122; H10K 59/123;
(Continued)

(56) References Cited

U.S. PATENT DOCUMENTS 7,279,708 B2    10/2007    Kwak et al.
7,944,140 B2    5/2011    Kwak et al.
(Continued)

FOREIGN PATENT DOCUMENTS

CN    203164564    8/2013
CN    103748538    4/2014
(Continued)

OTHER PUBLICATIONS

Non-Final Office Action dated Jun. 24, 2019, issued to U.S. Appl. No. 15/610,566.
(Continued)

*Primary Examiner* — Herve-Louis Y Assouman
*Assistant Examiner* — Christopher M Roland
(74) *Attorney, Agent, or Firm* — CANTOR COLBURN LLP

(57) ABSTRACT

A display device including a base layer, a circuit layer, a light emitting device layer, an organic layer, and a touch sensing unit. The base layer includes a display area and a non-display area. A plurality of insulation patterns overlaps the non-display area. The organic layer is disposed on the light emitting device and overlaps the plurality of insulation patterns and the organic light emitting diode. At least a
(Continued)

portion of the plurality of touch signal lines overlaps the plurality of insulation patterns.

4 Claims, 29 Drawing Sheets

Related U.S. Application Data division of application No. 15/610,566, filed on May 31, 2017, now Pat. No. 11,489,025.

(51) Int. Cl.
| | |
|---|---|
| *G06F 3/044* | (2006.01) |
| *G09G 3/3233* | (2016.01) |
| *H10K 50/805* | (2023.01) |
| *H10K 50/84* | (2023.01) |
| *H10K 59/122* | (2023.01) |
| *H10K 59/123* | (2023.01) |
| *H10K 59/131* | (2023.01) |
| *H10K 50/842* | (2023.01) |
| *H10K 102/10* | (2023.01) |

(52) U.S. Cl.
CPC ......... *G06F 3/0446* (2019.05); *G09G 3/3233* (2013.01); *H10K 50/805* (2023.02); *H10K 50/84* (2023.02); *H10K 59/122* (2023.02); *H10K 59/123* (2023.02); G06F 3/04164 (2019.05); G06F 2203/04111 (2013.01); G09G 2300/0809 (2013.01); *H10K 50/8426* (2023.02); *H10K 59/131* (2023.02); *H10K 2102/101* (2023.02)

(58) Field of Classification Search
CPC ................. H10K 59/131; H10K 59/40; H10K 2102/101; G06F 3/0412; G06F 3/04164; G06F 3/0443; G06F 3/0446; G06F 2203/04111; G09G 3/3233; G09G 2300/0809
See application file for complete search history.

(56) References Cited

U.S. PATENT DOCUMENTS

| | | | |
|---|---|---|---|
| 9,035,330 B2 | 5/2015 | Kang et al. |
| 9,391,296 B2 | 7/2016 | Park et al. |
| 9,773,994 B2 | 9/2017 | Kim |
| 9,939,978 B2 | 4/2018 | Chen et al. |
| 10,032,833 B2 | 7/2018 | Yamazaki et al. |
| 2004/0046917 A1 | 3/2004 | Nakayoshi et al. |
| 2005/0168666 A1 | 8/2005 | Kawasaki |
| 2007/0181944 A1 | 8/2007 | MacPherson et al. |
| 2012/0169217 A1 | 7/2012 | Kim et al. |
| 2013/0049003 A1 | 2/2013 | Choi et al. |
| 2013/0069853 A1 | 3/2013 | Choi |
| 2014/0117316 A1 | 5/2014 | Choi |
| 2015/0034921 A1 | 2/2015 | Kim |
| 2015/0069338 A1 | 3/2015 | Cho et al. |
| 2015/0116295 A1 | 4/2015 | Pyon |
| 2015/0171367 A1 | 6/2015 | Moon |
| 2015/0228927 A1 | 8/2015 | Kim |
| 2015/0372253 A1 | 12/2015 | Hong et al. |
| 2016/0103537 A1 | 4/2016 | Park et al. |
| 2016/0104863 A1 | 4/2016 | Park |
| 2016/0172621 A1 | 6/2016 | Jiao et al. |
| 2016/0268356 A1 | 9/2016 | Go et al. |
| 2016/0268362 A1 | 9/2016 | Shi et al. |
| 2017/0294618 A1 | 10/2017 | Ko et al. |
| 2018/0006265 A1 | 1/2018 | Oh |
| 2018/0033998 A1 | 2/2018 | Kim et al. |
| 2018/0061918 A1 | 3/2018 | Park et al. |
| 2018/0151838 A1 | 5/2018 | Park et al. |
| 2019/0006442 A1 | 1/2019 | Byun et al. |
| 2019/0148469 A1 | 5/2019 | Lhee et al. |
| 2022/0157913 A1 | 5/2022 | Choi et al. |

FOREIGN PATENT DOCUMENTS

| | | |
|---|---|---|
| CN | 104425518 A | 3/2015 |
| CN | 204904233 | 12/2015 |
| EP | 2960962 | 12/2015 |
| KR | 10-2014-0057426 | 5/2014 |
| KR | 10-2015-0016784 | 2/2015 |
| KR | 10-2015-0025994 | 4/2016 |
| KR | 10-2016-0038571 | 4/2016 |
| KR | 10-2016-0041708 | 4/2016 |
| KR | 10-2016-0043226 | 4/2016 |
| KR | 20160050847 A | 5/2016 |

OTHER PUBLICATIONS

Final Office Action dated Nov. 15, 2019, issued to U.S. Appl. No. 15/610,566.
Non-Final Office Action dated Mar. 27, 2020, issued to U.S. Appl. No. 15/610,566.
Final Office Action dated Oct. 4, 2020, issued to U.S. Appl. No. 15/610,566.
Notice of Allowance dated Jun. 23, 2022, issued to U.S. Appl. No. 15/610,566.
The Extended European Search Report dated May 12, 2017, issued in European Application No. 17183537.4.
Chinese Office Action dated Nov. 22, 2021, from the Chinese Patent Office for Chinese Patent No. 201710623671.
Non-Final Office Action dated Jun. 22, 2023, issued to U.S. Appl. No. 17/970,497.
Notice of Allowance dated Dec. 22, 2023, issued to U.S. Appl. No. 17/970,497.

TOUCH SENSING UNIT INTEGRATED DISPLAY DEVICE INCLUDING OUTGASSING HOLES

CROSS-REFERENCE TO RELATED APPLICATIONS

This application is a division of U.S. patent application Ser. No. 17/970,497, filed on Oct. 20, 2022, which is a division of U.S. patent application Ser. No. 15/610,566, filed on May 31, 2017, each of which claims priority from and the benefit of Korean Patent Application No. 10-2016-0097503, filed on Jul. 29, 2016, which are hereby incorporated by reference for all purposes as if fully set forth herein.

BACKGROUND

Field

Exemplary embodiments of the present disclosure relate to a display device, and more particularly, to a touch sensing unit integrated display device.

Discussion of the Background

Various display devices used for multi-media devices, such as televisions, mobile phones, tablet computers, navigations, and game consoles, are currently being developed. A keyboard or a mouse is included as an input device of a display device. Additionally, recent display devices include touch panels as input devices.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the present disclosure provide a touch sensing unit integrated display device with reduced noise.

Additional aspects will be set forth in the detailed description which follows, and, in part, will be apparent from the disclosure, or may be learned by practice of the inventive concept.

An exemplary embodiment of the inventive concept discloses a display device including: a base layer including a display area and a non-display area; a circuit layer including at least one intermediate insulation layer and a power supply electrode overlapping the non-display area, the circuit layer disposed on the base layer; a light emitting device layer including an organic light emitting diode including a first electrode disposed on the circuit layer, a light emitting layer, and a second electrode, a pixel definition layer, a connection electrode connecting the second electrode and the power supply electrode, and a plurality of insulation patterns overlapping the holes; a thin film encapsulation layer including an organic layer overlapping the plurality of insulation patterns and the organic light emitting diode and disposed on the light emitting device layer; and a touch sensing unit including at least one touch insulation layer, a plurality of touch electrodes, and a plurality of touch signal lines connected to the plurality of touch electrodes and disposed on the thin film encapsulation layer. At least a portion of the plurality of touch signal lines overlaps the plurality of insulation patterns.

An exemplary embodiment of the inventive concept also discloses a display device including a base layer including a display area and a non-display area; a circuit layer disposed on the base layer; a light emitting device layer including a light emitting diode disposed on the circuit layer, a pixel definition layer including an opening for exposing a first electrode of the light emitting diode, and a plurality of insulation patterns overlapping the non-display area; an organic layer disposed on the light emitting device layer and overlapping the plurality of insulation patterns and the light emitting diode; and a touch sensing unit including a plurality of touch electrodes and a plurality of touch signal lines connected to the plurality of touch electrodes and disposed on the organic layer. At least a portion of the plurality of touch signals overlaps the plurality of insulation patterns.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1A:
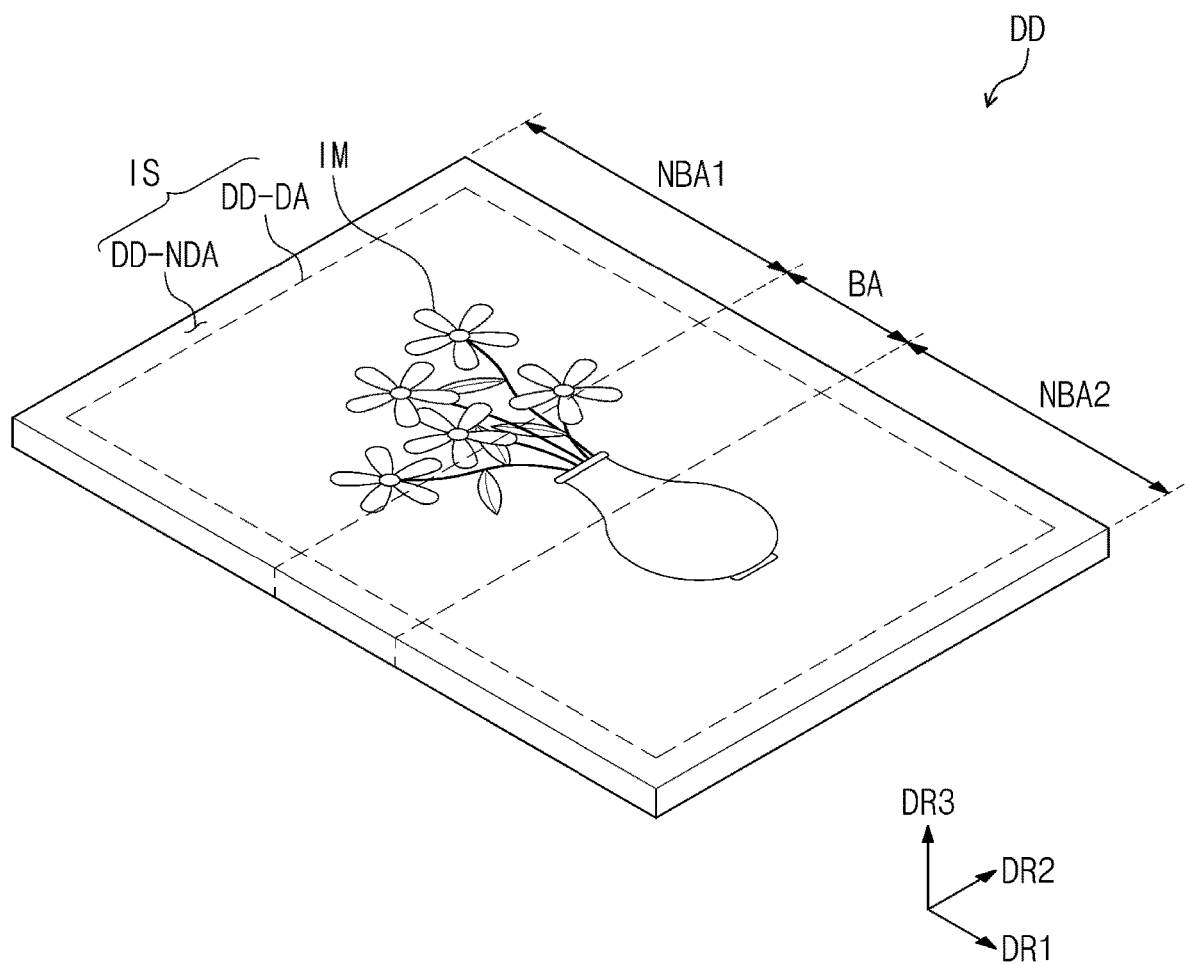
FIG. 1A is a perspective view according to a first operation of a display device according to an exemplary embodiment of the inventive concept.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1B:
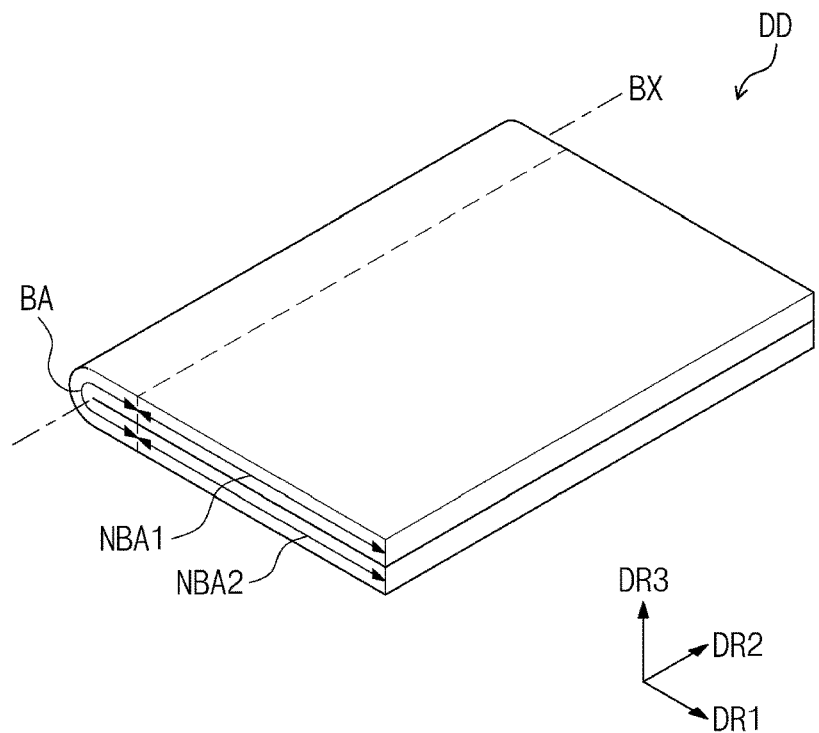
FIG. 1B is a perspective view according to a second operation of a display device according to an exemplary embodiment of the inventive concept.
Figure 1C:
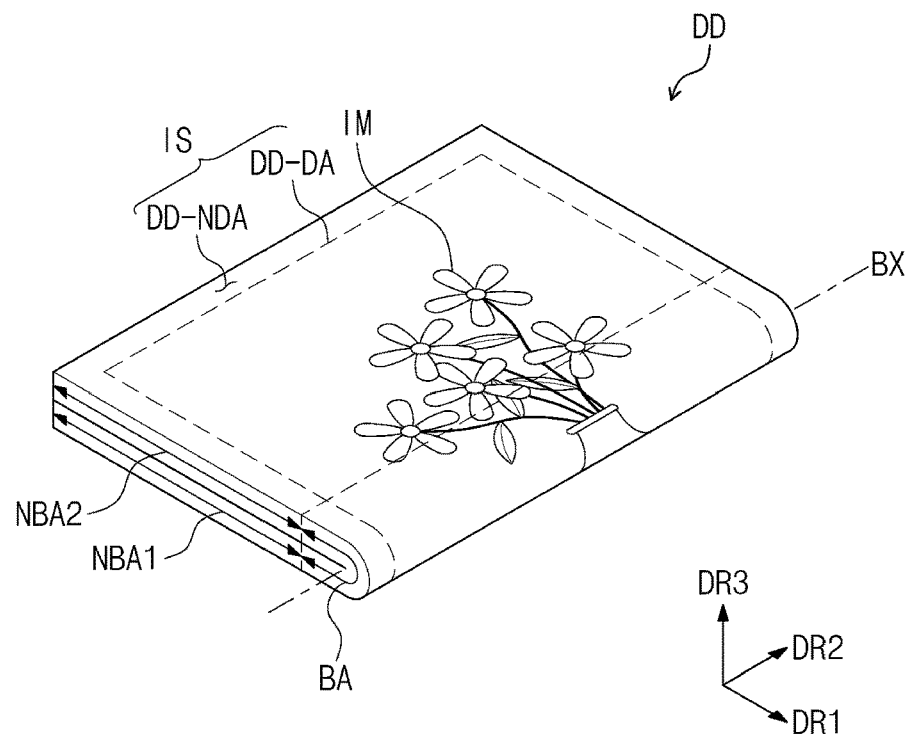
FIG. 1C is a perspective view according to a third operation of a display device according to an exemplary embodiment of the inventive concept.

FIG. 1A is a perspective view according to a first operation of a display device DD according to an exemplary embodiment of the inventive concept. FIG. 1B is a perspective view according to a second operation of the display device DD according to an exemplary embodiment of the inventive concept. FIG. 1C is a perspective view according to a third operation of the display device DD according to an exemplary embodiment of the inventive concept.

As shown in FIG. 1A, in a first operating mode, a display surface IS where an image IM is displayed is parallel to a surface defined by a first direction axis DR1 and a second direction axis DR2. The normal direction of the display surface IS, that is, a thickness direction of the display device DD, indicates a third direction axis DR3. The front surface (or an upper surface) and the rear surface (or a lower surface) of each member are divided by the third direction axis DR3. However, the directions that the first to third direction axes DR1, DR2, and DR3 indicate may be converted to other directions as a relative concept. Hereinafter, first to third directions as directions that the respective first to third direction axes DR1, DR2, and DR3 indicate refer to the same reference numerals.

FIGS. 1A to 1C illustrate a foldable display device as one example of the flexible display device DD. However, the inventive concept may relate to a rollable display device or a bended display device, and is not particularly limited. Additionally, although a flexible display device is shown in this exemplary embodiment, the inventive concept is not limited thereto. The display device DD according to this exemplary embodiment may be a flat and rigid display device. The flexible display device DD may be used for small and medium-sized electronic devices, such as mobile phones, tablets, car navigations, game consoles, and smart watches in addition to large-sized electronic devices, such as televisions and monitors.

As shown in FIG. 1A, the display surface IS of the flexible display device DD may include a plurality of areas. The flexible display device DD may include a display area DD-DA where an image IM is displayed and a non-display area DD-NDA adjacent to the display area DD-DA. The non-display area DD-NDA is an area where no image is displayed. FIG. 1A illustrates a vase as one example of the image IM. As one example, the display area DD-DA may have a rectangular form. The non-display area DD-NDA may surround the display area DD-DA. However, the inventive concept is not limited thereto, and a form of the display area DD-DA and a form of the non-display area DD-NDA may be designed relatively.

As shown in FIGS. 1A to 1C, the display device DD may include a plurality of areas defined according to an operation form. The display device DD may include a bending area BA that is bended on the basis of a bending axis BX, a first non-bending area NBA1, and a second non-bending area NBA2. As shown in FIG. 1B, the display device DD may be inner-bending to allow a display surface IS of the first non-bending area NBA1 and a display surface IS of the second non-bending area NBA2 to face each other. As shown in FIG. 1C, the display device DD may be outward-bending to allow the display surface IS to be exposed to the outside.

According to an exemplary embodiment of the inventive concept, the display device DD may include a plurality of bending areas BA. Moreover, the bending area BA may be defined in correspondence in a manner according to how a user may manipulate the display device DD. For example, unlike FIGS. 1B and 1C, the bending area BA may be defined parallel to the first direction axis DR1 and may be defined in a diagonal direction. An area of the bending area BA is not fixed and may be determined according to the radius of curvature. According to an exemplary embodiment of the inventive concept, the display device DD may be configured to repeat only the operating mode shown in FIGS. 1A and 1B.

Figure 2:
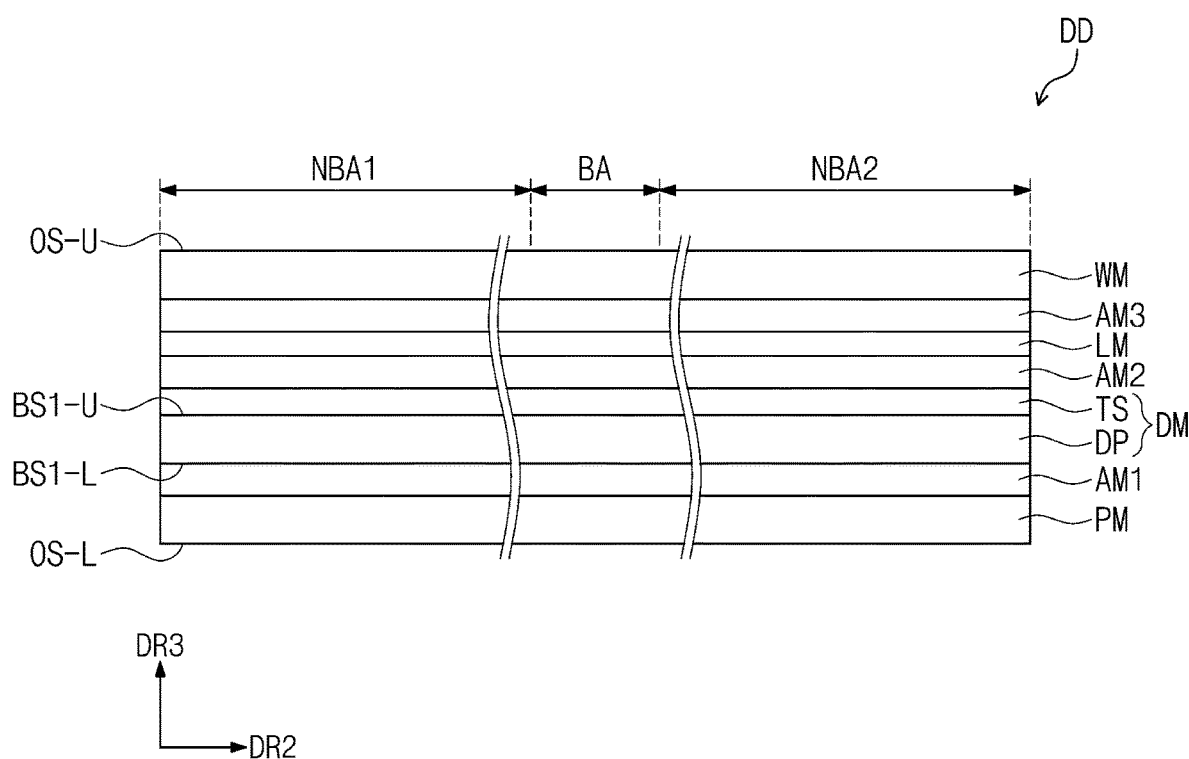
FIG. 2 is a sectional view of a display device according to an exemplary embodiment of the inventive concept.

FIG. 2 is a sectional view of a display device DD according to an exemplary embodiment of the inventive concept. FIG. 2 shows a section defined by a second direction axis DR2 and a third direction axis DR3.

As shown in FIG. 2, the display device DD may include a protective film PM, a display module DM, an optical member LM, a window WM, a first adhesive member AM1, a second adhesive member AM2, and a third adhesive member AM3. The display module DM is disposed between the protective film PM and the optical member LM. The optical member LM is disposed between the display module DM and the window WM. The first adhesive member AM1 bonds the display module DM and the protective film PM, the second adhesive member AM2 bonds the display module DM and the optical member LM, and the third adhesive member AM3 bonds the optical member LM and the window WM. Although FIG. 2 illustrates that lengths in the second direction DR2 of the protective film PM, the display module DM, the optical member LM, the window WM, the first adhesive member AM1, the second adhesive member AM2, and the third adhesive member AM3 are the same, the display device DD according to the inventive concept is not limited thereto.

The protective film PM protects the display module DM. The protective film PM provides a first outer surface OS-L exposed to the outside and provides an adhesive surface adhering to the first adhesive member AM1. The protective film PM may absorb external impacts and inhibit moisture from penetrating into the display module DM.

The protective film PM may include a plastic film as a base layer. The protective film PM may include a plastic film as a base substrate. The protective film PM may include a plastic film including one selected from the group consisting of polyethersulfone (PES), polyacrylate, polyetherimide (PEI), polyethylenenaphthalate (PEN), polyethyleneterephthalate (PET), polyphenylene sulfide (PPS), polyarylate, polyimide (PI), polycarbonate (PC), poly(arylene ether-sulfone), and a combination thereto. A material constituting the protective film PM is not limited to plastic resins and may include an organic/inorganic composite material. The protective film PM may include an inorganic material filled in the pores of a porous organic layer and an organic layer. The protective film PM may further include a functional layer formed at a plastic film. The functional layer may include a resin layer. The functional layer may be formed through a coating method. According to an exemplary embodiment of the inventive concept, the protective film PM may be omitted.

The window WM is provided and an adhesive surface adhering to the second adhesive member AM2 is provided. Referring to FIGS. 1A to 1C, the window WM may protect the display module DM from an external impact and provide an input surface to a user. The display surface IS of the window WM may be a second outer surface OS-U.

The window WM may include a plastic film as a base substrate. The window WM may have a multilayer structure. The base member of the window WM may have a multilayer structure selected from a glass substrate, a plastic film, and a plastic substrate. The window WM may further include a bezel pattern. The multilayer structure may be formed through a continuous process or an adhering process using an adhesive layer. In addition, the window WM may further include a functional layer disposed at a base member. The functional layer may include a hard coating layer, an anti-fingerprint layer, anti-reflective layer, and a self-healing layer.

The optical member LM reduces an external light reflectance. The optical member LM may include at least a polarizing film. The optical member LM may further include a phase difference film. According to an exemplary embodiment of the inventive concept, the optical member LM may be omitted.

The display module DM may include a display panel DP and a touch sensing unit TS. The display panel DP may be an organic light emitting display panel but is not limited especially. For example, the display panel DP may be a quantum dot light emitting display panel that is another type of self-light emitting display panel. In relation to the quantum dot light emitting display panel, a light emitting layer includes quantum dots and quantum rods. Hereinafter, the display panel DP will be described as an "organic light emitting display panel".

The touch sensing unit TS is directly disposed on the organic light emitting display panel DP. In this specification, "directly disposed" means "being formed" through a continuous process, excluding "attached" through an additional adhesive layer.

The organic light emitting display panel DP generates the image IM (see FIG. 1A) corresponding to inputted image data. The organic light emitting display panel DP provides a first display panel surface BS1-L and a second display panel surface BS1-U facing a thickness direction DR3. In this exemplary embodiment, although the organic light emitting display panel DP is described, the display panel is not limited thereto.

The touch sensing unit TS obtains coordinate information of an external input. The touch sensing unit TS, for example, may detect an external input through a capacitance method. In this inventive concept, an operating method of the touch sensing unit TS is not limited especially and, according to an exemplary embodiment of the inventive concept, the touch sensing unit TS may detect an external input through an electromagnetic induction method or a pressure detection method.

Although not shown separately, the display module DM according to an exemplary embodiment of the inventive concept may further include an anti-reflective layer. The anti-reflective layer may include a color filter or a layer-stacked structure of conductive layer/insulation layer/conductive layer. The anti-reflective layer may reduce an external light reflectance by absorbing, destructive-interfering, or polarizing the light incident from the outside. The anti-reflective layer may replace a function of the optical member LM.

Each of the first adhesive member AM1, the second adhesive member AM2, and the third adhesive member AM3 may be an organic adhesive layer, such as an Optically Clear Adhesive (OCA) film, Optically Clear Resin (OCR), or a Pressure Sensitive Adhesive (PSA) film. The organic adhesive layer may include an adhesive material, such as a polyurethane, polyacrylic, polyester, polyepoxy, and polyvinyl acetate. As a result, an organic adhesive layer corresponds to one of organic layers.

Although not shown separately, the display device DD may further include a frame structure for supporting the functional layers in order to maintain a state shown in FIGS. 1A to 1C. The frame structure may include an articulated structure or a hinge structure.

Figure 3A:
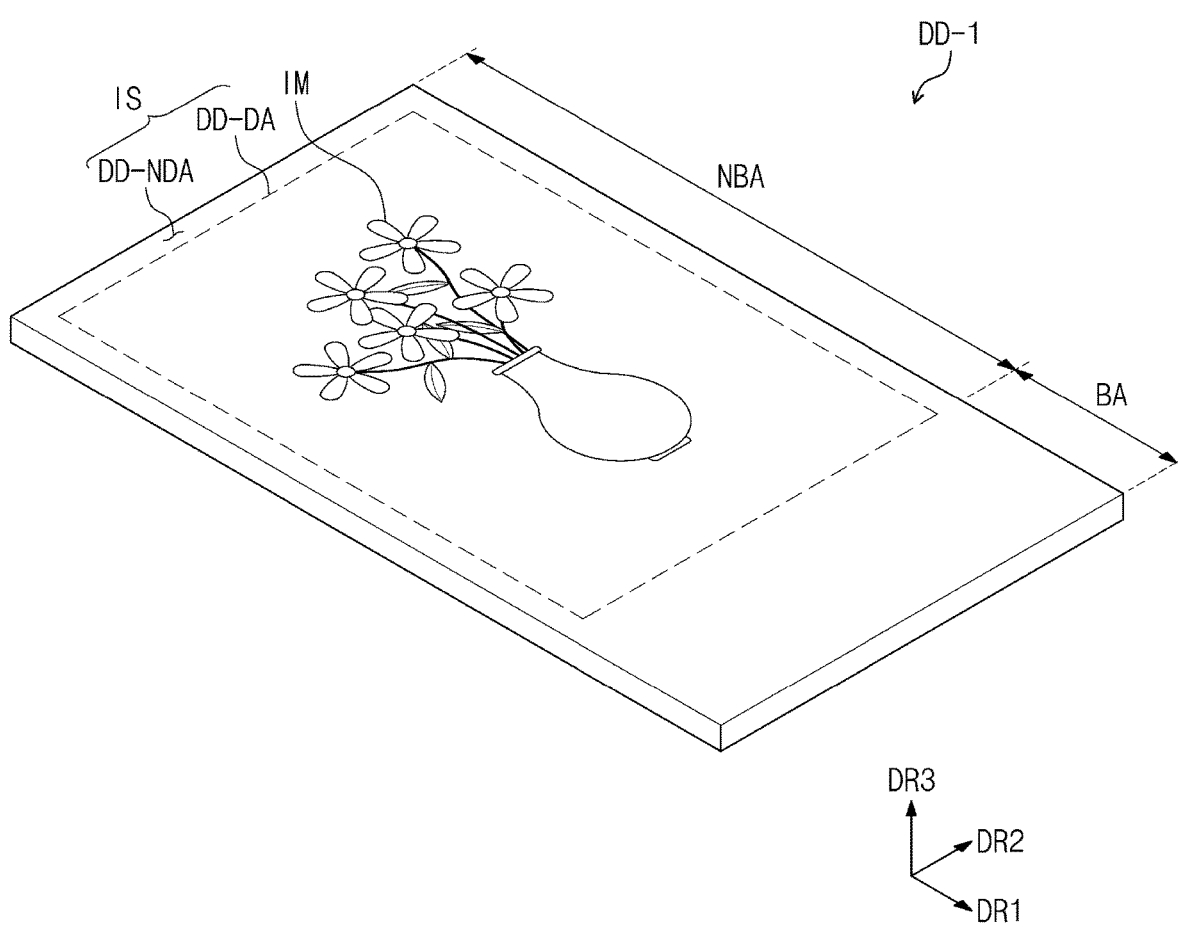
FIG. 3A and FIG. 3B are perspective views of a display device according to an exemplary embodiment of the inventive concept.
Figure 3B:
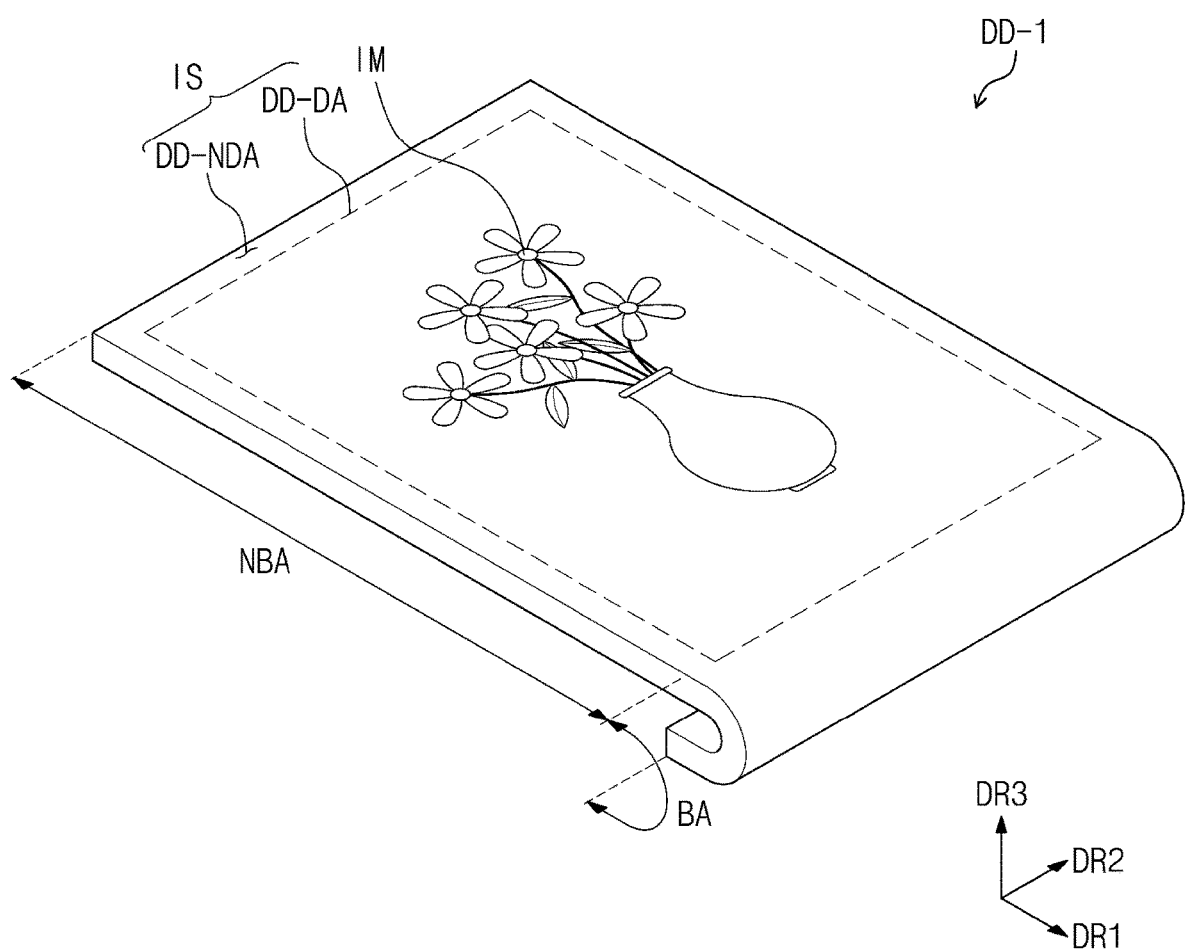
Figure 4:
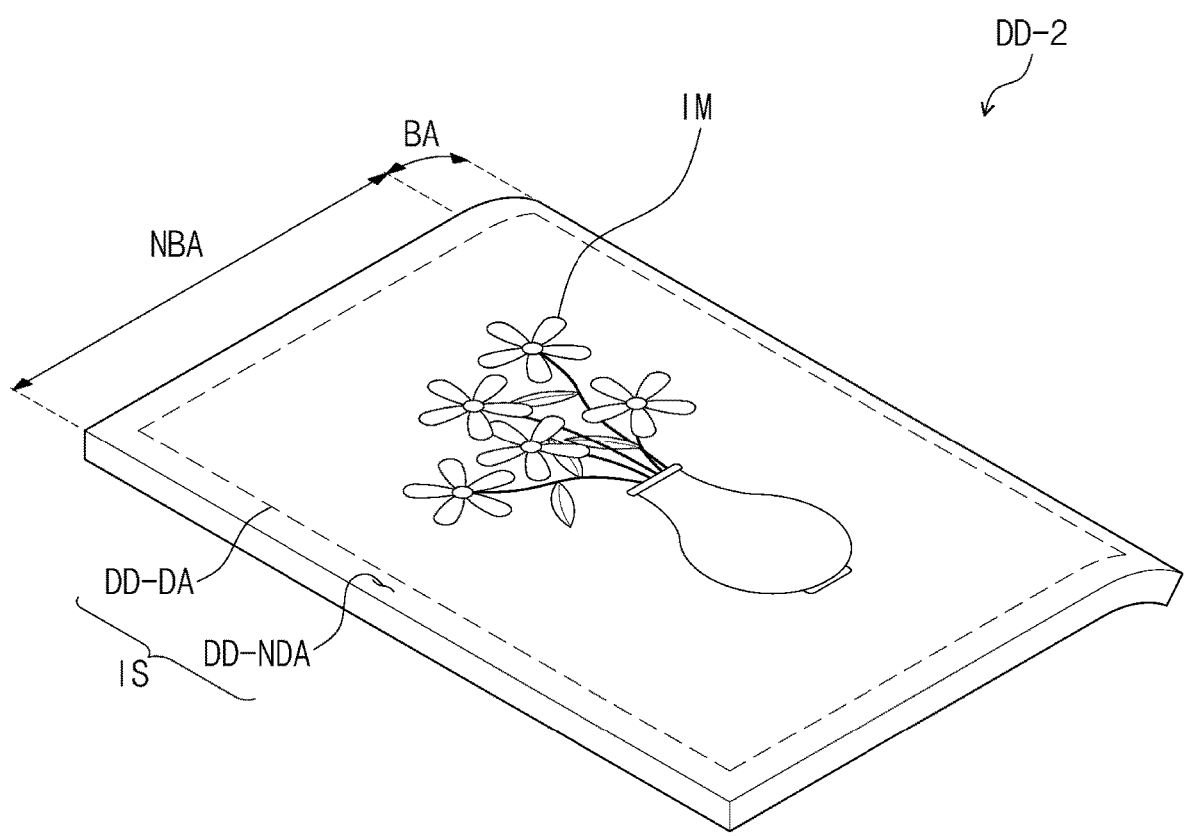
FIG. 4 is a perspective view of a display device according to an exemplary embodiment of the inventive concept.
Figure 4:
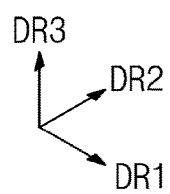

FIGS. 3A and 3B are perspective views of a display device DD-1 according to an exemplary embodiment of the inventive concept. FIG. 3A shows the display device DD-1 in an unfolded state, and FIG. 3B shows the display device DD-1 in a bended state. FIG. 4 is a perspective view of a display device DD-2 according to an exemplary embodiment of the inventive concept.

As shown in FIGS. 3A and 3B, the display device DD-1 may include one bending area BA and one non-bending area NBA. The non-display area DD-NDA of the display device DD-1 may be bent. However, according to an exemplary embodiment of the inventive concept, the bending area of the display device DD-1 may be changed.

Unlike the display device DD shown in FIGS. 1A to 1C, the display device DD-1 may be fixed in one form and operate. As shown in FIG. 3B, the display device DD-1 may be a bended display device operating in a bended state. The display device DD-1 may be fixed at a frame in a bended state, and the frame may be bonded to the housing of an electronic device.

The display device DD-1 may have the same sectional structure as that shown in FIG. 2. However, the non-bending area NBA and the bending area BA may have a different layer-stacked structure. The non-bending area NBA may have the same sectional structure as that shown in FIG. 2, and the bending area BA may have a different sectional structure than that shown in FIG. 2. The optical member LM and the window WM need not be disposed in the bending area BA. That is, the optical member LM and the window WM may be disposed in only the non-bending area NBA. The second adhesive member AM2 and the third adhesive member AM3 also need not be disposed in the bending area BA.

As shown in FIG. 4, the display device DD-2 may include one bending area BA and one non-bending area NBA. One bending area BA may be defined along an edge extending in the first direction DR1 of the display device DD-2. However, according to an exemplary embodiment of the inventive concept, the display device DD-2 may include two bending areas facing each other in the second direction DR2. The two bending areas may extend in the first direction DR1 and each may extend along two edges facing each other in the second direction DR2.

Figure 5A:
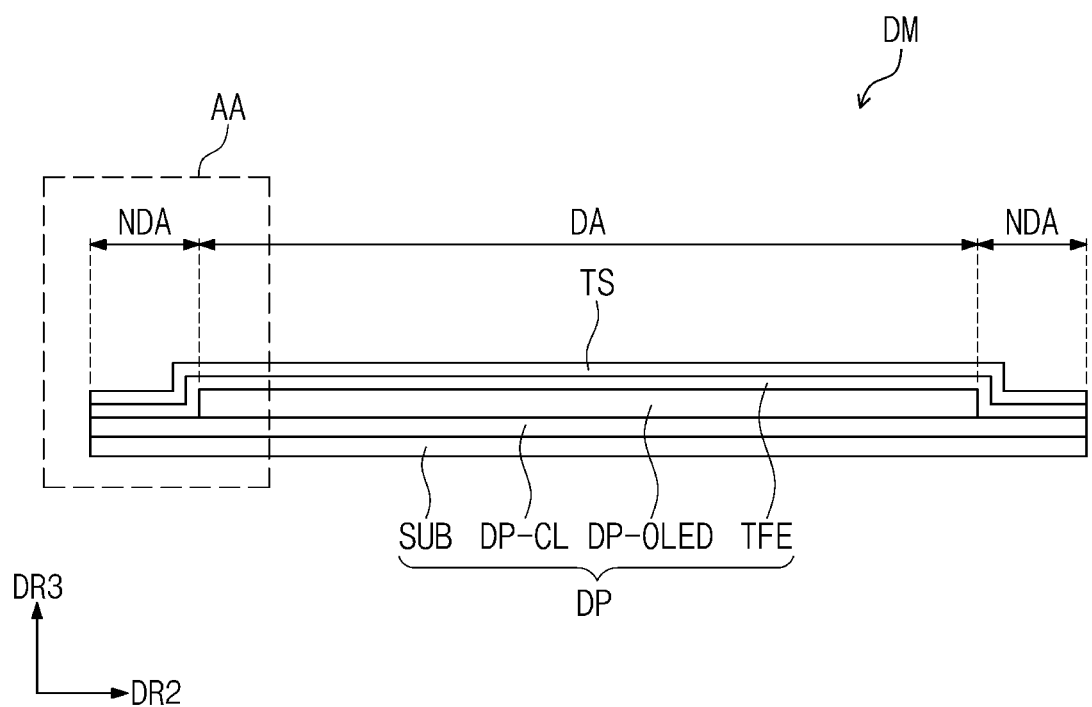
FIG. 5A is a sectional view of a display module according to an exemplary embodiment of the inventive concept.
Figure 5B:
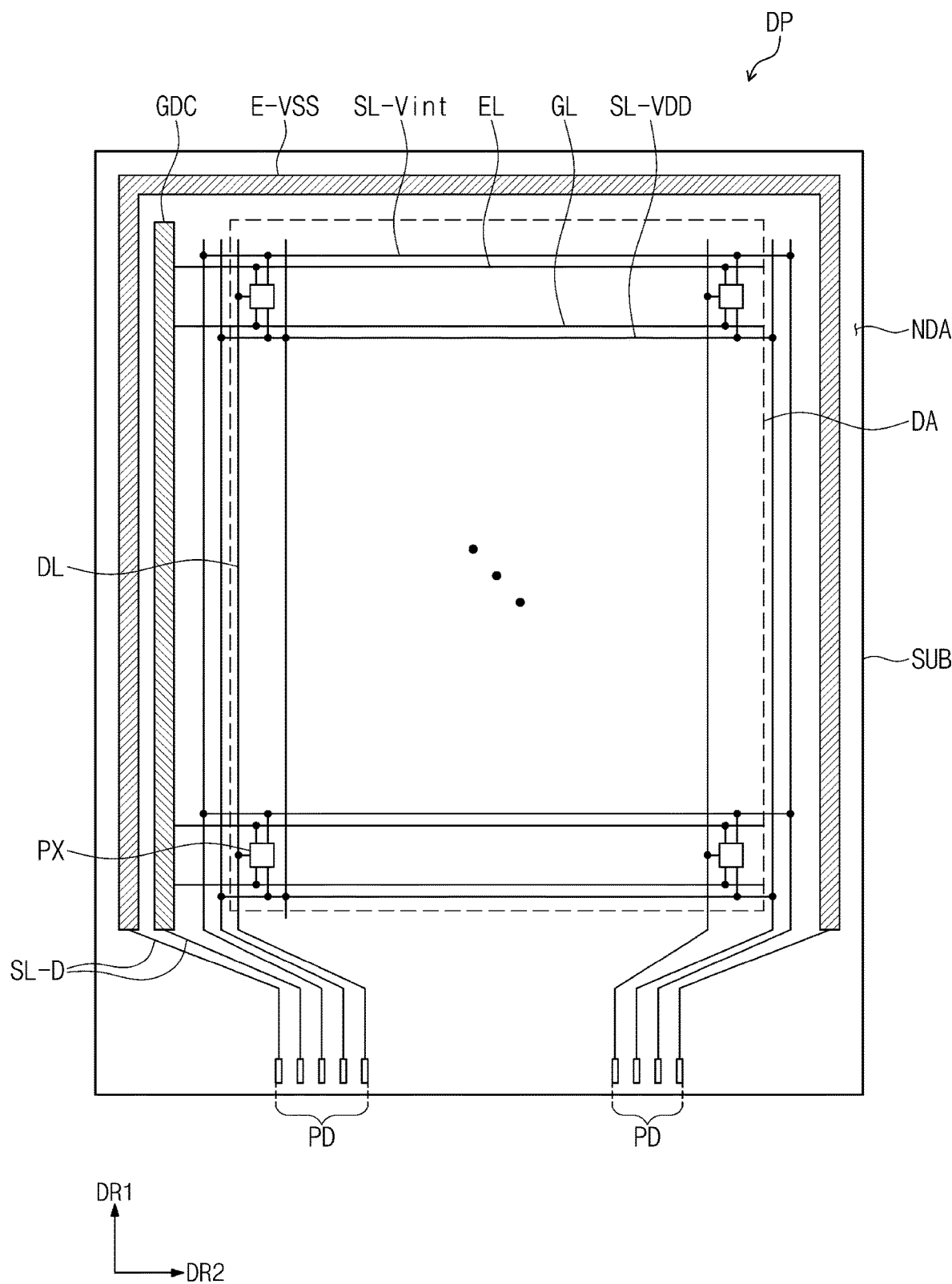
FIG. 5B is a plan view of a display module according to an exemplary embodiment of the inventive concept.
Figure 6A:
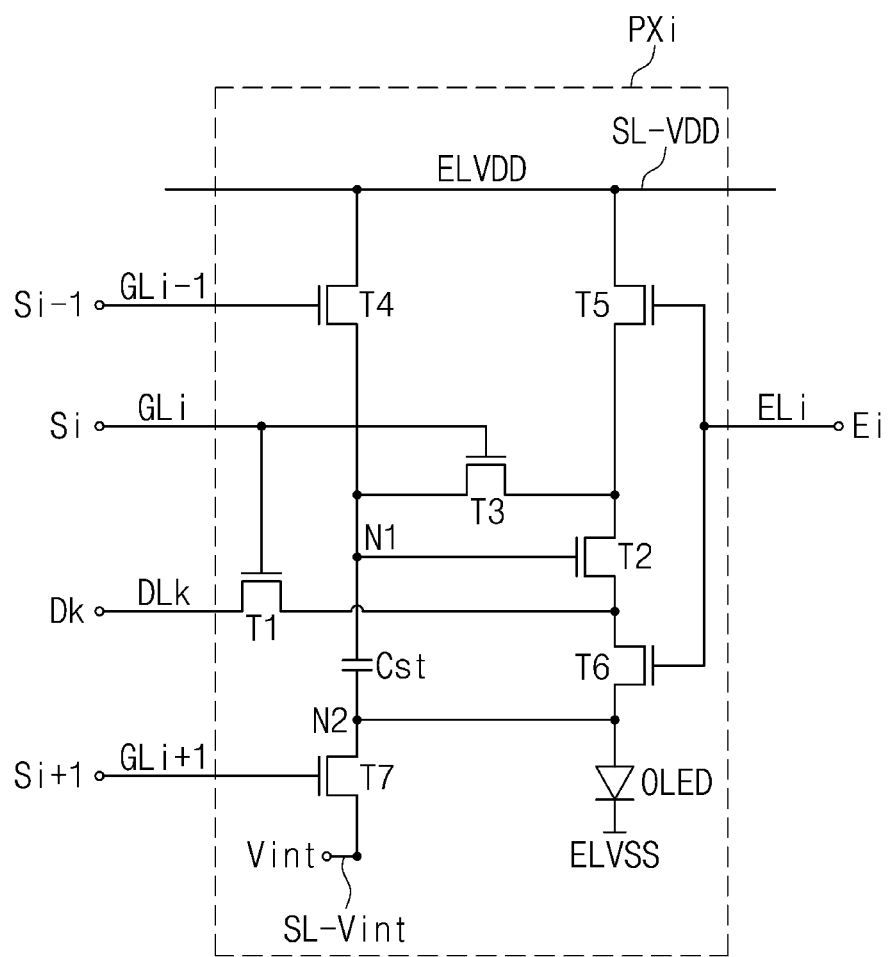
FIG. 6A is an equivalent circuit diagram of a pixel according to an exemplary embodiment of the inventive concept.
Figure 6B:
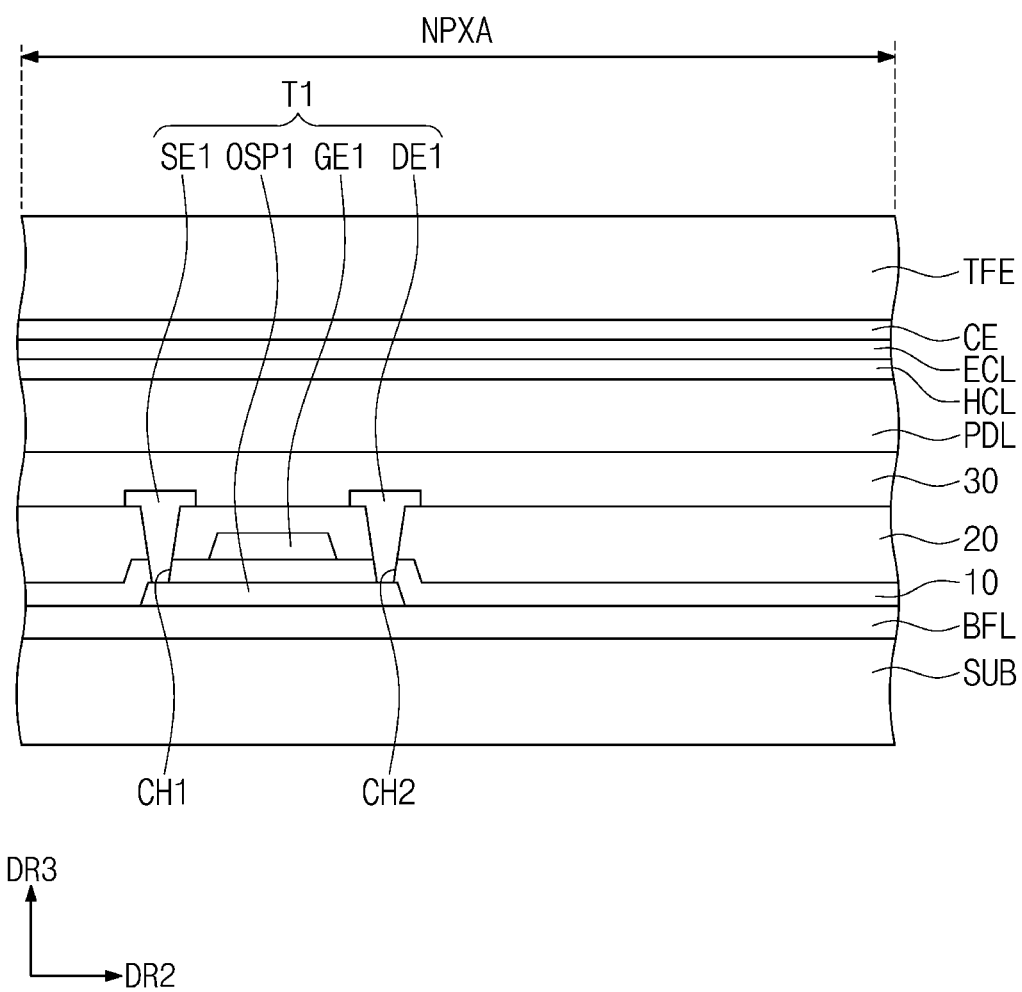
FIG. 6B and FIG. 6C are partial sectional views of an organic light emitting display panel according to an exemplary embodiment of the inventive concept.
Figure 6C:
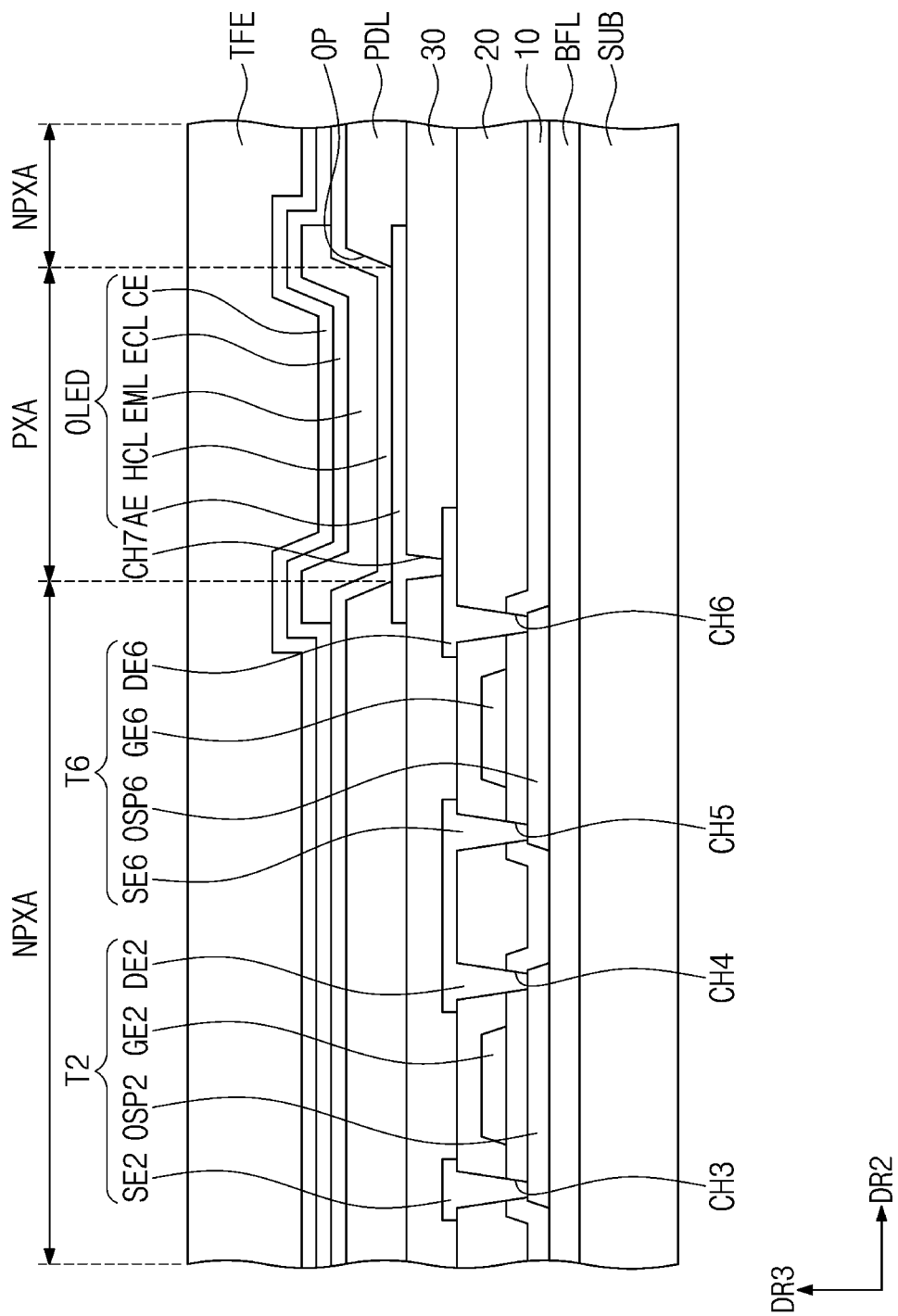

FIG. 5A is a sectional view of a display module DM according to an exemplary embodiment of the inventive concept. FIG. 5B is a plan view of an organic light emitting display panel DP according to an exemplary embodiment of the inventive concept. FIG. 6A is an equivalent circuit diagram of a pixel PXi according to an exemplary embodiment of the inventive concept. FIGS. 6B and 6C are partial sectional views of an organic light emitting display panel DP according to an exemplary embodiment of the inventive concept.

As shown in FIG. 5A, the organic light emitting display panel DP includes a base layer SUB, a circuit layer DP-CL disposed on the base layer SUB, a light emitting device layer DP-OLED, and a thin film encapsulation layer TFE. The base layer SUB may include at least one plastic film. The base layer SUB may include a plastic substrate, a glass substrate, a metal substrate, or an organic/inorganic composite material substrate as a flexible substrate.

The circuit layer DP-CL may include at least one intermediate insulation layer, a plurality of conductive layers, and a semiconductor layer. The plurality of conductive layers of the circuit layer DP-CL may constitute signal lines or a driving circuit of a pixel. The light emitting device layer DP-OLED includes at least organic light emitting diodes. The thin film encapsulation layer TFE seals the light emitting device layer DP-OLED. The thin film encapsulation layer TFE includes an inorganic layer and an organic layer. The thin film encapsulation layer TFE may include at least two inorganic layers and an organic layer therebetween. The inorganic layers protect the light emitting device layer DP-OLED from moisture/oxygen and the organic layer protects the light emitting device layer DP-OLED from a foreign material such as dust particles. The inorganic layer may include a silicon nitride layer, a silicon oxynitride layer, and a silicon oxide layer, a titanium oxide layer, or an aluminum oxide layer. The organic layer may include an acryl-based organic layer, but is not limited thereto.

The touch sensing unit TS is directly disposed on the thin film encapsulation layer TFE. The touch sensing unit TS includes touch electrodes and touch signal lines. The touch electrodes and the touch signal lines may have a single or multi-layer structure.

The touch electrodes and the touch signal lines may include indium tin oxide (ITO), indium zinc oxide (IZO), zinc oxide (ZnO), indium tin zinc oxide (ITZO), PEDOT, metal nano wire, or graphene. The touch electrodes and the touch signal lines may include a metal layer, for example, molybdenum, silver, titanium, copper, aluminum, or alloys thereof. The touch electrodes and the touch signal lines may have the same or different layer structure. Specific contents on the touch sensing unit TS will be described later.

As shown in FIG. 5B, the organic light emitting display panel DP includes a display area DA and a non-display area NDA on a plane. In this exemplary embodiment, the non-display area NDA may be defined along the outline of the display area DA. The display area DA and the non-display area NDA of the organic light emitting display panel DP correspond to the display area DD-DA and the non-display area DD-NDA of the display area DD, respectively. The display area DA and the non-display area NDA of the organic light emitting display panel DP may not be necessarily identical to the display area DD-DA and the non-display area DD-NDA of the display area DD, and may vary according to a structure/design of the organic light emitting display panel DP.

The organic light emitting display panel DP includes a driving circuit GDC, a plurality of signal lines SL-Vint, SL-VDD, EL, GL, DL, and SL-D, a power supply electrode E-VSS, and a plurality of pixels PX. An area where the plurality of pixels PX are disposed may be defined as the display area DA.

The scan driving circuit GDC may include a scan driving circuit GDC. The scan driving circuit GDC generates a plurality of scan signals and sequentially outputs the plurality of scan signals to a plurality of scan lines GL described later. Additionally, the scan driving circuit GDC generates a plurality of light emitting control signals and outputs the plurality of light emitting control signals to a plurality of light emitting control lines EL described later.

Although it is shown in FIG. 5B that the plurality of scan signals and the plurality of light emitting control signals are outputted from one scan driving circuit GDC, the inventive concept is not limited thereto. According to an exemplary embodiment of the inventive concept, a plurality of scan driving circuit may divide and output a plurality of scan signals and divide and output a plurality of light emitting control signals. Additionally, according to an exemplary embodiment of the inventive concept, a driving circuit for generating and outputting a plurality of scan signals and a driving circuit for generating and outputting a plurality of light emitting control signals may be divided and be separate from each other. Another scan driving circuit facing the scan driving circuit GDC shown in FIG. 5B in a second direction may be further disposed.

The scan driving circuit GDC may be included in the circuit layer DP-CL. The scan driving circuit GDC may include a plurality of thin film transistors formed through the same process as the driving circuit of the pixel PX.

Although not shown separately in the drawing, the organic light emitting display panel DP may further include a data driving circuit bonded to the pads PD in a chip on film (COF) form. According to an exemplary embodiment of the inventive concept, the data driving circuit may be also integrated on the circuit layer DP-CL.

A plurality of signal lines GL, DL, EL, SL-VDD, SL-Vint, and SL-D may include scan lines GL, light emitting control lines EL, data lines DL, a power line SL-VDD, an initialization voltage line SL-Vint, and a dummy signal line SL-D. The plurality of signal lines GL, DL, EL, SL-VDD, SL-Vint, and SL-D may be included in the circuit layer DP-CL, and some lines may be omitted. The pads PD may be connected to the end parts of the plurality of signal lines GL, DL, EL, SL-VDD, SL-Vint, and SL-D.

The scan lines GL are respectively connected to corresponding pixels PX among the plurality of pixels PX, and the data lines DL are respectively connected to corresponding pixels PX among the plurality of pixels PX. Each of the light emitting control lines EL may be arranged parallel to a corresponding scan line GL among the scan lines GL.

The power line SL-VDD may be connected to the plurality of pixels PX and provide a first power supply voltage to the plurality of pixels PX. The voltage line SL-VDD may include a plurality of lines extending in the first direction DR1 and a plurality of lines extending in the second direction DR2.

The initialization voltage line SL-Vint may provide initialization voltage to the plurality of pixels PX. The initialization voltage line SL-Vint may include a plurality of lines extending in the first direction DR1 and a plurality of lines extending in the second direction DR2.

The dummy signal line SL-D may provide control signals to the scan driving circuit GDC. The dummy signal line SL-D may provide a second power supply voltage to the power supply electrode E-VSS. The second power supply voltage has a different voltage level than the first power supply voltage. The second power supply voltage may have a lower voltage level than the first power supply voltage.

The power supply electrode E-VSS is disposed in the non-display area NDA and has a form extending along the outline of the base layer SUB. As shown in FIG. 5B, the power supply electrode E-VSS may have a form facing three outlines. The power supply electrode E-VSS may be also included in the circuit layer DP-CL.

FIG. 6A exemplarily shows the ith pixel PXi connected to the kth data line DLk among the plurality of data lines DL1 to DLm. The ith pixel PXi is activated in response to the ith scan signal Si applied to the ith scan line SLi.

The ith pixel PXi includes an organic light emitting diode OLED and a pixel driving circuit for controlling the organic light emitting diode. The pixel driving circuit may include seven thin film transistors T1 to T7 and one capacitor Cst. Although the pixel driving circuit including the seven thin film transistors T1 to T7 and one capacitor Cst is shown in an exemplarty embodiment, it is sufficient that the pixel PXi includes a first transistor T1 (or a driving transistor), a second transistor T2 (or a switching transistor), and a capacitor Cst, as a driving circuit for driving the organic light emitting diode OLED, and the pixel driving circuit may be modified in various ways.

The driving transistor controls a driving current supplied to the organic light emitting diode OLED. The output electrode of the second transistor T2 is electrically connected to the organic light emitting diode OLED. The output electrode of the second transistor T2 may directly contact the first electrode of the organic light emitting diode OLED or may be connected to the first electrode of the organic light emitting diode OLED through another transistor (for example, the sixth transistor T6 in this exemplary embodiment).

The control electrode of the control transistor may receive a control signal. A control signal applied to the ith pixel PXi may include the i−1th scan signal Si−1, the ith scan signal Si, the i+1th scan signal Si+1, a data signal DK, and the ith light emitting control signal Ei. According to an exemplary embodiment of the inventive concept, the control transistor may include the first transistor T1 and the third to seventh transistors T3 to T7.

The first transistor T1 includes an input electrode connected to the kth data line DLk, a control electrode connected to the ith scan line GLi, and an output electrode connected to the output electrode of the second transistor T2. The first transistor T1 is turned on by the scan signal Si (hereinafter referred to as the ith scan signal) applied to the ith scan line GLi, and provides a data signal Dk applied to the kth data line DLk to the capacitor Cst.

FIG. 6B is a sectional view of a part corresponding to the first transistor T1 of the equivalent circuit shown in FIG. 6A. FIG. 6C is a sectional view of a part corresponding to the second transistor T2, the sixth transistor T6, and the organic light emitting diode OLED of the equivalent circuit shown in FIG. 6A.

Referring to FIGS. 6B and 6C, a buffer layer BFL may be disposed on the base layer SUB. The buffer layer BFL improves the bonding strength of the base layer SUB and conductive patterns or semiconductor patterns. The buffer layer BFL may include an inorganic layer. Although not shown separately in the drawing, a barrier layer for preventing a foreign material from entering may be further disposed on an upper surface of the base layer SUB. The buffer layer BFL and the barrier layer may be selectively disposed/omitted.

A semiconductor pattern OSP1 (hereinafter referred to as a first semiconductor pattern) of the first transistor T1, a semiconductor pattern OSP2 (hereinafter referred to as a second semiconductor pattern) of the second transistor T2, and a semiconductor pattern OSP6 (hereinafter referred to as a sixth semiconductor pattern) of the sixth transistor T6 are disposed on the buffer layer BFL. The first semiconductor pattern OSP1, the second semiconductor pattern OSP2, and the sixth semiconductor pattern OSP6 may be selected from amorphous silicon, polysilicon, and metal oxide semiconductors.

A first insulation layer 10 may be disposed on the first semiconductor pattern OSP1, the second semiconductor pattern OSP2, and the sixth semiconductor pattern OSP6. Although it is shown in FIGS. 6B and 6C that the first insulation layer 10 is provided as a layer form for covering the first semiconductor pattern OSP1, the second semiconductor pattern OSP2, and the sixth semiconductor pattern OSP6, the first insulation layer 10 may be provided as a pattern disposed corresponding to the first semiconductor pattern OSP1, the second semiconductor pattern OSP2, and the sixth semiconductor pattern OSP6.

The first insulation layer 10 may include a plurality of inorganic layers. The plurality of inorganic layers may include a silicon nitride layer, a silicon oxynitride layer, and a silicon oxide layer.

A control electrode GE1 (hereinafter referred to as a "first control electrode") of the first transistor T1, a control electrode GE2 (hereinafter referred to as a "second control electrode") of the second transistor T2, and a control electrode GE6 (hereinafter referred to as a "sixth control electrode") of the sixth transistor T6 are disposed on the first insulation layer 10. The first control electrode GE1, the second control electrode GE2, and the sixth control electrode GE6 may be fabricated according to the same photolithography process as the scan lines GL (see FIG. 5A).

A second insulation layer 20 for covering the first control electrode GE1, the second control electrode GE2, and the sixth control electrode GE6 may be disposed on the first insulation layer 10. The second insulation layer 20 may provide a flat upper surface. The second insulation layer 20 may include an organic material and/or an inorganic material.

An input electrode SE1 (hereinafter referred to as a "first input electrode") and an output electrode DE1 (hereinafter referred to as a "first output electrode") of the first transistor T1, an input electrode SE2 (hereinafter referred to as a "second input electrode") and an output electrode DE2 (hereinafter referred to as a "second output electrode") of the second transistor T2, and an input electrode SE6 (hereinafter referred to as a "sixth input electrode") and an output electrode DE6 (hereinafter referred to as a "sixth output electrode") of the sixth transistor T6 are disposed on the second insulation layer 20.

The first input electrode SE1 and the first output electrode DE1 are respectively connected to the first semiconductor pattern OSP1 through a first penetration hole CH1 and a second penetration hole CH2 penetrating the first insulation layer 10 and the second insulation layer 20. The second input electrode SE2 and the second output electrode DE2 are respectively connected to the second semiconductor pattern OSP2 through a third penetration hole CH3 and a fourth penetration hole CH4 penetrating the first insulation layer 10 and the second insulation layer 20. The sixth input electrode SE6 and the sixth output electrode DE6 are respectively connected to the sixth semiconductor pattern OSP6 through a fifth penetration hole CH5 and a sixth penetration hole CH6 penetrating the first insulation layer 10 and the second insulation layer 20. On the other hand, according to another exemplary embodiment of the inventive concept, at least one of the first transistor T1, the second transistor T2, and the sixth transistor T6 may be modified and implemented as a bottom gate structure.

A third insulation layer 30 for covering the first input electrode SE1, the second input electrode SE2, the sixth input electrode SE6, the first output electrode DE1, the second output electrode DE2, and the sixth output electrode DE6 is disposed on the second insulation layer 20. The third insulation layer 30 may include an organic layer and/or an inorganic layer. The third insulation layer 30 may also include an organic material for providing a flat surface.

The first insulation layer 10, the second insulation layer 20, and the third insulation layer 30 may be defined as "intermediate insulation layers". One of the first insulation layer 10, the second insulation layer 20, and the third insulation layer 30 may be omitted according to a circuit structure of a pixel.

A pixel definition layer PDL and an organic light emitting diode OLED are disposed on the third insulation layer 30. A first electrode AE is disposed on the third insulation layer 30. The first electrode AE is connected to the sixth output electrode DE6 through a seventh penetration hole CH7 penetrating the third insulation layer 30. An opening OP is defined in the pixel definition layer PDL. The opening OP of the pixel definition layer PDL exposes at least a part of the first electrode AE.

The pixel PX may be disposed in a pixel area on a plane. The pixel area may include a light emitting area PXA and a non-light emitting area NPXA adjacent to the light emitting area PXA. The non-light emitting area NPXA may surround the light emitting area PXA. According to this exemplary embodiment, the light emitting area PXA is defined corresponding to a partial area of the first electrode AE exposed by the opening OP.

A hole control layer HCL may be commonly disposed in the light emitting area PXA and the non-light emitting area NPXA. Although not separately shown in the drawing, a common layer, such as the hole control layer HCL, may be commonly formed in the plurality of pixels PX (see FIG. 5A).

A light emitting layer EML is disposed on the hole control layer HCL. The light emitting layer EML may be disposed in an area corresponding to the opening OP. That is, the light emitting layer EML may be divided and formed at each of the plurality of pixels PX. The light emitting layer EML may include an organic material and/or an inorganic material. Although the patterned light emitting layer EML is shown according to this exemplary embodiment, the light emitting layer EML may be commonly disposed in the plurality of pixels PX. At this point, the light emitting layer EML may generate white light. Additionally, the light emitting layer EML may have a multilayer structure.

An electronic control layer ECL is disposed on the light emitting layer EML. Although not separately shown in the drawing, the electronic control layer ECL may be commonly formed at the plurality of pixels PX (see FIG. 5A).

A second electrode CE is disposed on the electronic control layer ECL. The second electrode CE is commonly disposed at the plurality of pixels PX.

A thin film encapsulation layer TFE is disposed on the second electrode CE. The thin film encapsulation layer TFE is commonly disposed at the plurality of pixels PX. According to this exemplary embodiment, the thin film encapsulation layer TFE directly covers the second electrode CE. According to an exemplary embodiment of the inventive concept, a capping layer for covering the second electrode CE may be further disposed between the thin film encapsulation layer TFE and the second electrode CE. At this point, the thin film encapsulation layer TFE may directly cover the capping layer.

Figure 7A:
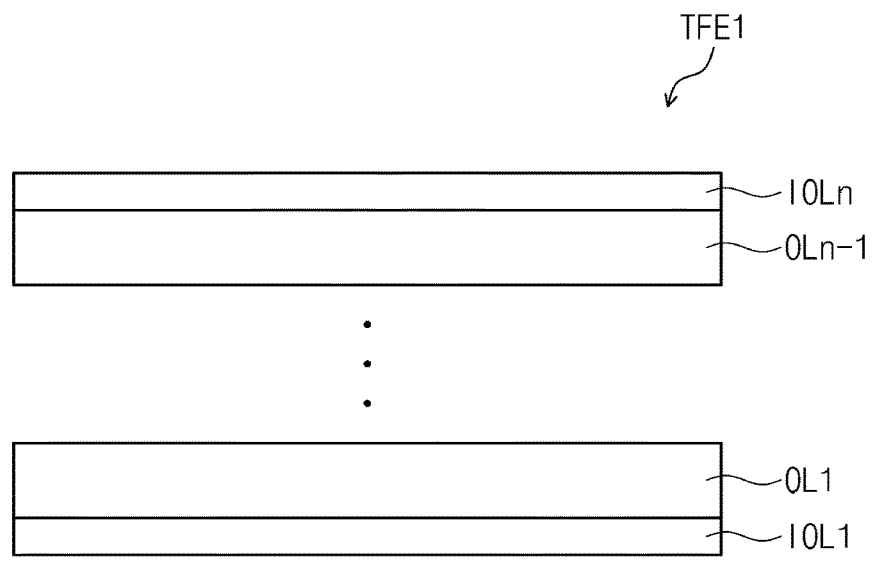
FIG. 7A, FIG. 7B, and FIG. 7C are sectional views of a thin film encapsulation layer according to an exemplary embodiment of the inventive concept.
Figure 7B:
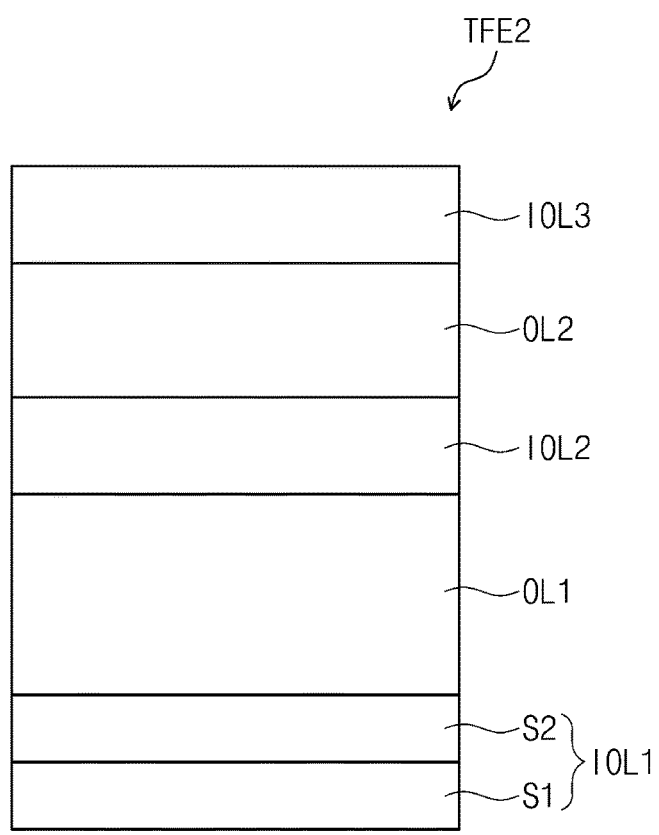
Figure 7C:
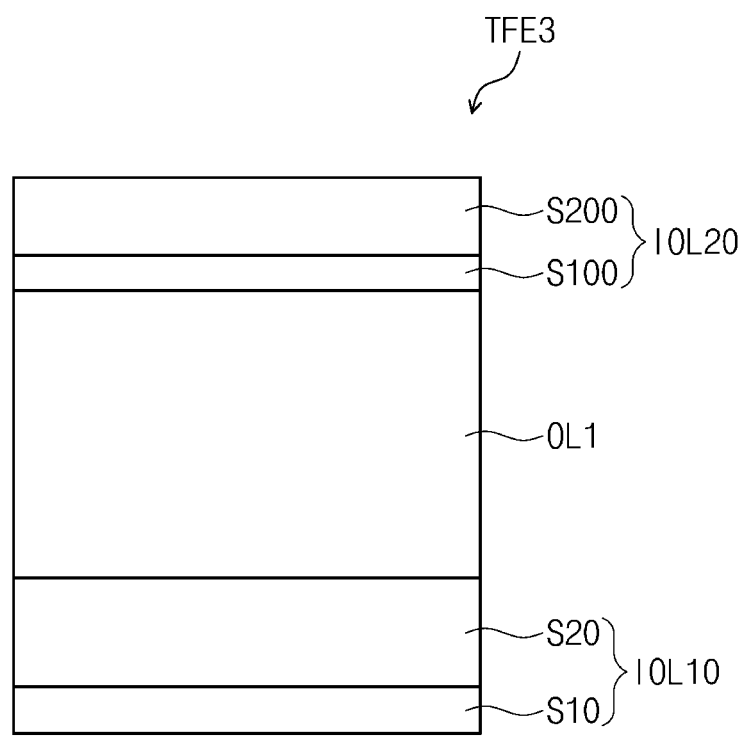

FIGS. 7A to 7C are sectional views of thin film encapsulation layers TFE1, TFE2, and TFE3 according to an exemplary embodiment of the inventive concept. Hereinafter, the thin film encapsulation layers TFE1, TFE2, and TFE3 according to an exemplary embodiment of the inventive concept are described with reference to FIGS. 7A to 7C.

As shown in FIG. 7A, the thin film encapsulation layer TFE1 may include n inorganic layers IOL1 to IOLn. The thin film encapsulation layer TFE1 may include n−1 organic layers OL1 to OLn−1 and the n−1 organic layers OL1 to OLn−1 and the n inorganic layers IOL1 to IOLn may be disposed alternately. The n−1 organic layers OL1 to OLn−1 may have a greater thickness than the n inorganic layers IOL1 to IOLn on average.

Each of the n inorganic layers IOL1 to IOLn may be a single layer including one material or a multilayer including each different material. Each of the n−1 organic layers OL1 to OLn−1 may be formed by depositing, printing, or coating organic monomers. The organic monomers may include an acryl-based monomer.

As shown in FIGS. 7B and 7C, inorganic layers included in each of the thin film encapsulation layers TFE2 and TFE3 may have the same or different inorganic material, and may have the same or different thickness. Organic layers included in each of the thin film encapsulation layers TFE2 and TFE3 may have the same or different organic material, and may have the same or different thickness.

As shown in FIG. 7B, the thin film encapsulation layer TFE2 may include a first inorganic layer IOL1, a first organic layer OL1, a second inorganic layer IOL2, a second organic layer OL2, and a third inorganic layer IOL3, which are sequentially stacked.

The first inorganic layer IOL1 may have a two-layer structure. A first sub layer S1 and a second sub layer S2 may include different inorganic materials.

As shown in FIG. 7C, the thin film encapsulation layer TFE3 may include a first inorganic layer IOL10, a first organic layer OL1, and a second inorganic layer IOL20, which are sequentially stacked. The first inorganic layer IOL10 may have a two-layer structure. A first sub layer S10 and a second sub layer S20 may include different inorganic materials. The second inorganic layer IOL20 may have a two-layer structure. The second inorganic layer IOL20 may include a first sub layer S100 and a second sub layer S200, which are deposited in different deposition environments. The first sub layer S100 may be deposited under a low power condition and the second sub layer S200 may be deposited under a high power condition. The first sub layer S100 and the second sub layer S200 may include the same inorganic material.

Figure 8A:
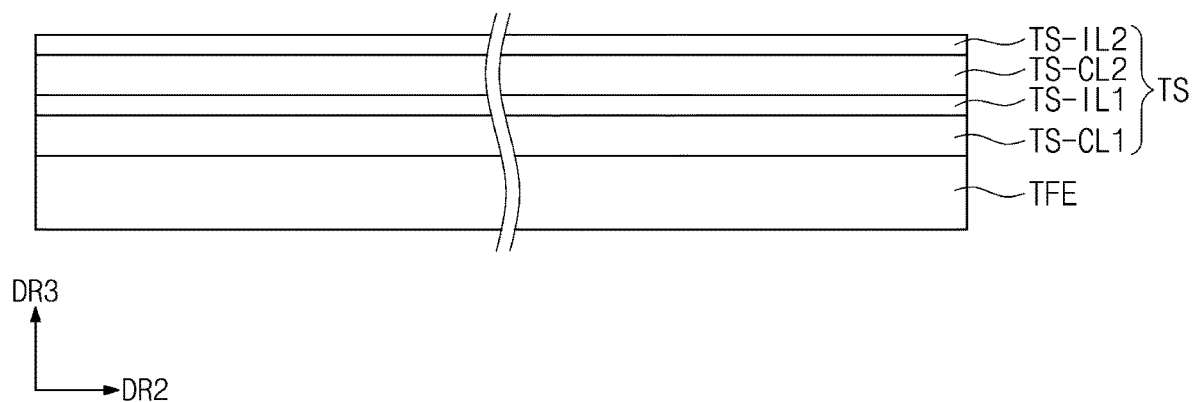
FIG. 8A is a sectional view of a touch sensing unit according to an exemplary embodiment of the inventive concept.

FIG. 8A is a sectional view of a touch sensing unit TS according to an exemplary embodiment of the inventive concept. FIGS. 8B to 8F are plan views of the touch sensing unit TS according to an exemplary embodiment of the inventive concept.

As shown in FIG. 8A, the touch sensing unit TS includes a first conductive layer TS-CL1, a first insulation layer TS-IL1 (hereinafter referred to as a "first touch insulation layer"), a second conductive layer TS-CL2, and a second insulation layer TS-IL2 (hereinafter referred to as a "second touch insulation layer"). The first conductive layer TS-CL1 is directly disposed on the thin film encapsulation layer TFE. The inventive concept is not limited thereto, and another inorganic layer or organic layer may be further disposed between the first conductive layer TS-CL1 and the thin film encapsulation layer TFE. Each of the first conductive layer TS-CL1 and the second conductive layer TS-CL2 may include a single layer structure or a multilayer structure stacked along the third direction axis DR3. A conductive layer of the multilayer structure may include at least two of transparent conductive layers and metal layers. A conductive layer of the multilayer structure may include metal layers with different metals. The transparent conductive layer may include indium tin oxide (ITO), indium zinc oxide (IZO), zinc oxide (ZnO), indium tin zinc oxide (ITZO), PEDOT, metal nano wire, or graphene. The metal layer may include silver, titanium, copper, aluminum, and an alloy thereof. For example, each of the first conductive layer TS-CL1 and the second conductive layer TS-CL2 may have a three-layer structure of titanium/aluminum/titanium.

Each of the first conductive layer TS-CL1 and the second conductive layer TS-CL2 includes a plurality of patterns. Hereinafter, the first conductive layer TS-CL1 includes first conductive patterns and the second conductive layer TS-CL2 includes second conductive patterns. Each of the first conducive patterns and the second conducive patterns may include touch electrodes and touch signal lines.

Each of a first touch insulation layer TS-IL1 and a second touch insulation layer TS-IL2 may include an inorganic material or an organic material. The inorganic material may include at least one of aluminum oxide, titanium oxide, silicon oxide, silicon oxynitride, zirconium oxide, and hafnium oxide. The organic material may include at least one of acrylic resin, methacrylic resin, polyisoprene, vinyl resin, epoxy resin, urethane resin, cellulose resin, siloxane-based resin, polyimide-based resin, polyamide-based resin, and perylene resin.

Each of the first touch insulation layer TS-IL1 and the second touch insulation layer TS-IL2 may have a single layer or multilayer structure. Each of the first touch insulation layer TS-IL1 and the second touch insulation layer TS-IL2 may include at least one of an inorganic layer or an organic layer. The inorganic layer and the organic layer may be formed through a chemical vapor deposition method.

It is sufficient that the first touch insulation layer TS-IL1 insulates a first conductive layer TS-CL1 and a second conductive layer TS-CL2, and its form is not limited. According to the forms of first conductive patterns and second conductive patterns, the form of the first touch insulation layer TS-IL1 may be changed. The first touch insulation layer TS-IL1 may cover the thin film encapsulation layer TFE entirely or may include a plurality of insulation patterns. It is sufficient that the plurality of insulation patterns overlap first connection parts CP1 or second connection parts CP2, to be described later.

Although the second-layer touch sensing unit is shown in this exemplary embodiment, the inventive concept is not so limited. A single-layer touch sensing unit includes a conductive layer and an insulation layer for covering the conductive layer. The conductive layer includes touch electrodes and touch signal lines connected to the touch electrodes. The single-layer touch sensing unit may obtain coordinate information through a self-cap method.

Figure 8B:
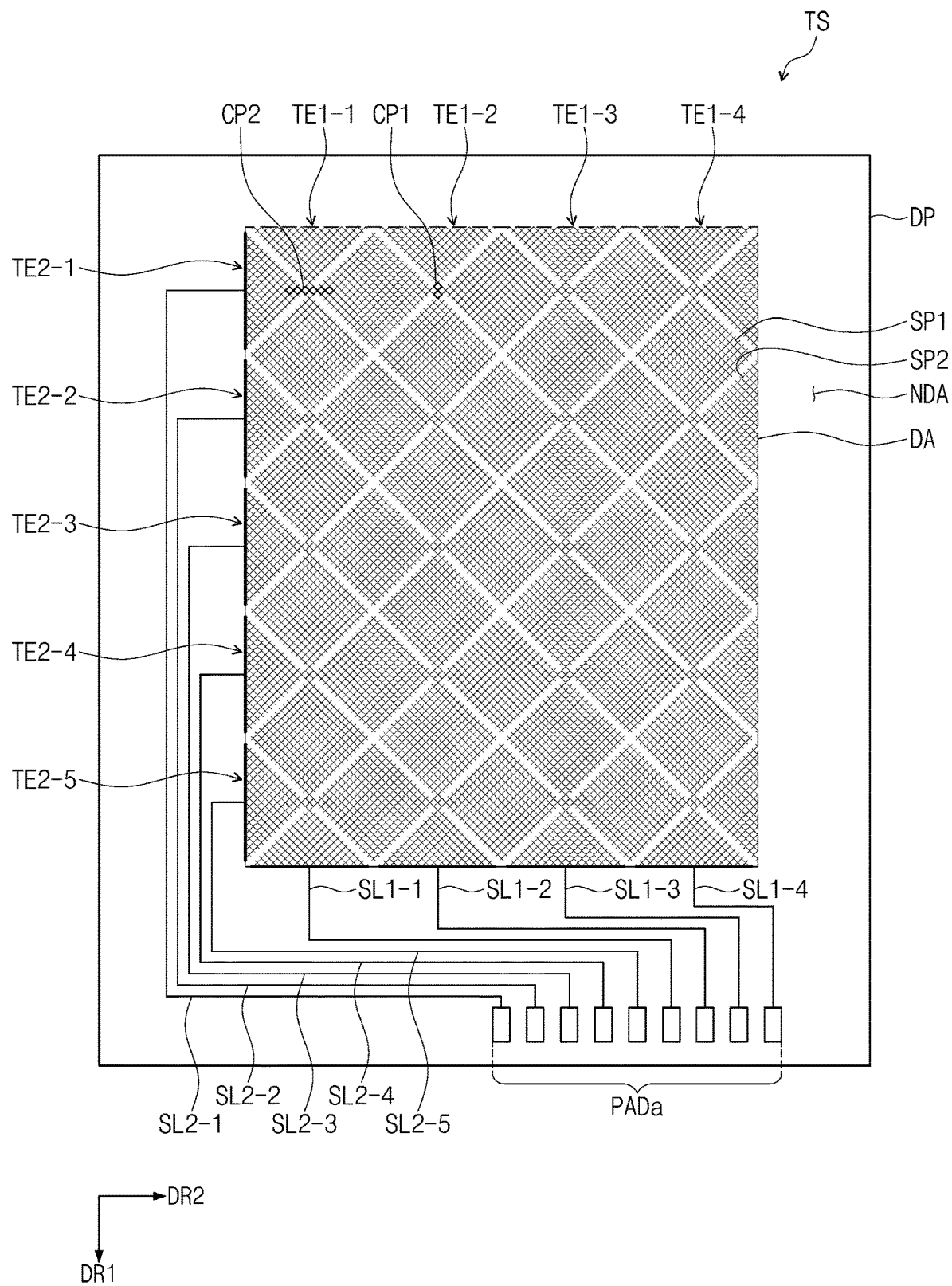
FIG. 8B, FIG. 8C, FIG. 8D, FIG. 8E, and FIG. 8F are plan views of a touch sensing unit according to an exemplary embodiment of the inventive concept.

As shown in FIG. 8B, the touch sensing unit TS may include first touch electrodes TE1-1 to TE1-4, first touch signal lines SL1-1 to SL1-4 connected to the first touch electrodes TE1-1 to TE1-4, second touch electrodes TE2-1 to TE2-5, second touch signal lines SL2-1 to SL2-5 connected to the second touch electrodes TE2-1 to TE2-5, and a pad part PADa connected to the first touch signal lines SL1-1 to SL1-4 and the second touch signal lines SL2-1 to SL2-5. Although the touch sensing unit TS including the four first touch electrodes TE1-1 to TE1-4 and the five second touch electrodes TE2-1 to TE2-5 is shown in FIG. 8B in an exemplary embodiment, the inventive concept is not limited thereto.

Each of the first touch electrodes TE1-1 to TE1-4 may have a mesh form in which a plurality of touch openings are defined. Each of the first touch electrodes TE1-1 to TE1-4 includes a plurality of first touch sensor parts SP1 and a plurality of first connection parts CP1. The first touch sensor parts SP1 are arranged along the first direction DR1. Each of the first connection parts CP1 connects adjacent two first touch sensor parts SP1 among the first touch sensor parts SP1. Although not shown in the drawing separately, the first touch signal lines SL1-1 to SL1-4 may also have a mesh form.

The second touch electrodes TE2-1 to TE2-5 intersect, and are insulated from, the first touch electrodes TE1-1 to TE1-4. Each of the second touch electrodes TE2-1 to TE2-5 may have a mesh form in which a plurality of touch openings are defined. Each of the second touch electrodes TE2-1 to TE2-5 includes a plurality of second touch sensor parts SP2 and a plurality of second connection parts CP2. The second touch sensor parts SP2 are arranged along the second direction DR2. Each of the second connection parts CP2 connects adjacent two first touch sensor parts SP2 among the second touch sensor parts SP2. The second touch signal lines SL2-1 to SL2-5 may also have a mesh form.

The first touch electrodes TE1-1 to TE1-4 are electrostatically bonded to the second touch electrodes TE2-1 to TE2-5. As touch detection signals are applied to the first touch electrodes TE1-1 to TE1-4, capacitors are formed between the first touch sensor parts SP1 and the second touch sensor parts SP2.

Parts of the plurality of first touch sensor parts SP1, the plurality of first connection parts CP1 and first touch signal lines SL1-1 to SL1-4, the plurality of second touch sensor parts SP2, the plurality of second connection parts CP2, and second touch signal lines SL2-1 to SL2-5 may be formed by patterning the first conductive layer TS-CL1 shown in FIG. 8A, and the other parts may be formed by patterning the second conductive layer TS-CL2 shown in FIG. 8A.

Although the touch sensing unit TS in which the plurality of first connection parts CP1 and the plurality of second connection parts CP2 intersect is shown in an exemplary embodiment, the inventive concept is not limited thereto. For example, each of the second connection parts CP2 may be modified to a V-shaped form in order not to overlap the plurality of first connection parts CP1. The V-shaped second connection parts CP2 may overlap the first touch sensor parts SP1. Although the first touch sensor parts SP1 and the second touch sensor parts SP2 in a rhombus form are shown in an exemplary embodiment, the inventive concept is not limited thereto.

Figure 8C:
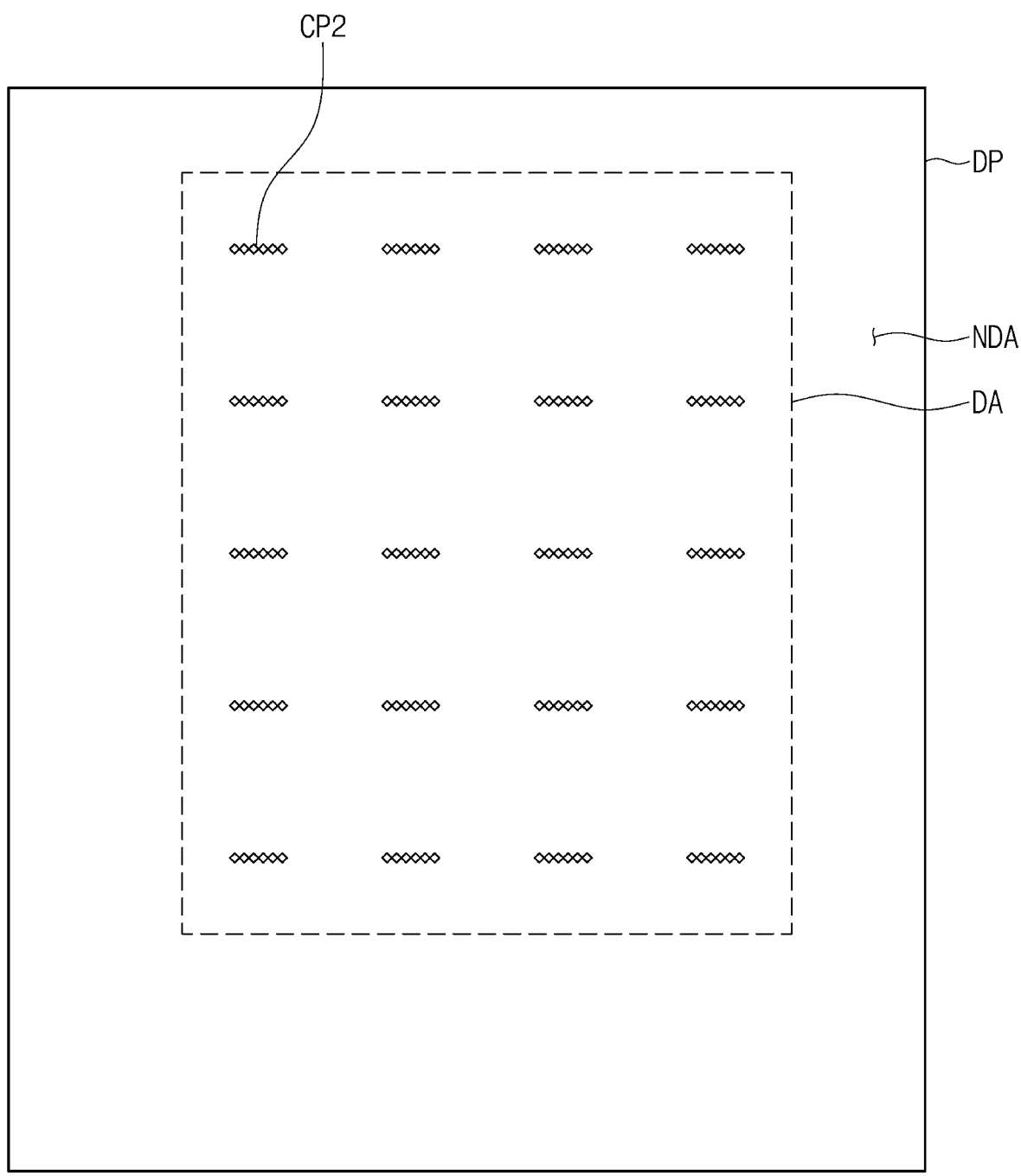

As shown in FIG. 8C, first conductive patterns are disposed on a base surface providing from the display panel DP. The thin film encapsulation layer TFE (see FIG. 5A) may provide the base surface. In an exemplary embodiment, the circuit layer DP-CL (see FIG. 5A) may provide a portion of the base surface when the thin film encapsulation layer TFE exposes a portion of the circuit layer DP-CL. The first conductive patterns may include second connection parts CP2. The bridge patterns CP2 may be directly disposed on the thin film encapsulation layer TFE. The bridge patterns CP2 correspond to the second connection parts CP2 shown in FIG. 8B.

Figure 8D:
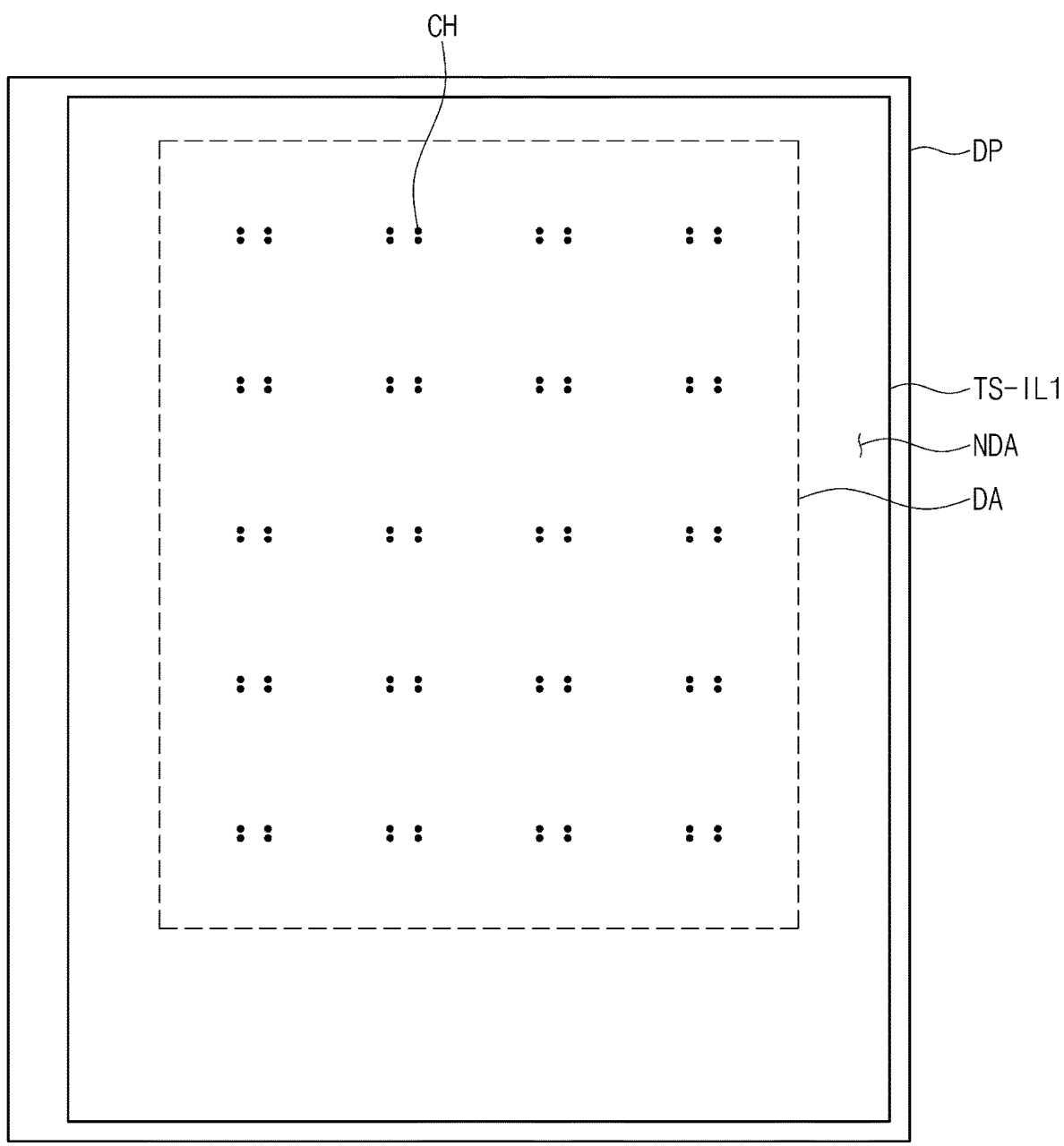

As shown in FIG. 8D, a first touch insulation layer TS-IL1 for covering the bridge patterns CP2 is disposed on the thin film encapsulation layer TFE. Contact holes CH for partially exposing the bridge patterns CP2 are defined in the first touch insulation layer TS-IL1. The contact holes CH may be formed through a photolithograph process.

Figure 8E:
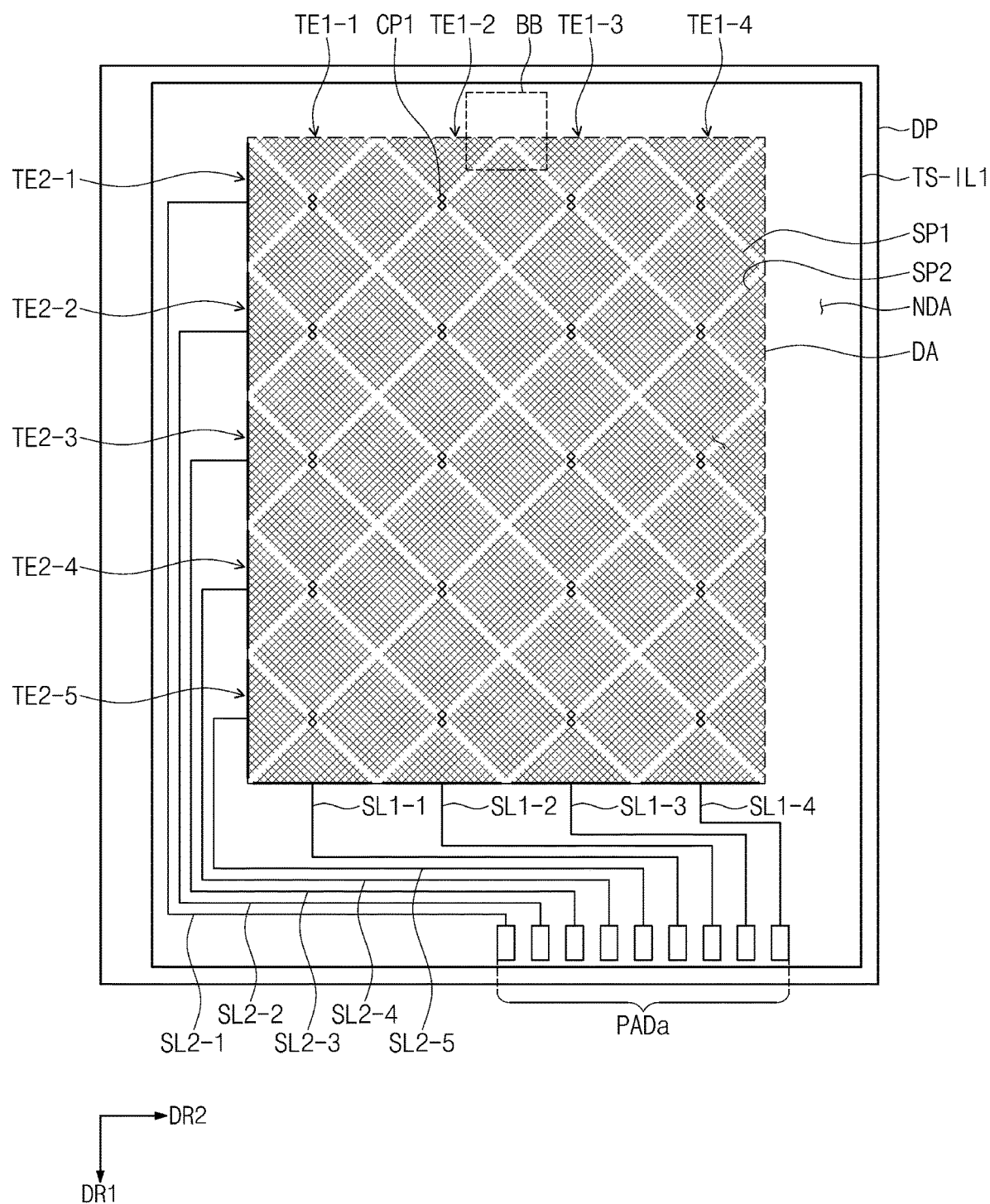

As shown in FIG. 8E, second conductive patterns are disposed on the first touch insulation layer TS-IL1. The second conductive patterns may include the plurality of first touch sensor parts SP1, the plurality of first connection parts CP1 and first touch signal lines SL1-1 to SL1-4, and the plurality of second touch sensor parts SP2 and second touch signal lines SL2-1 to SL2-5. Although not separately shown in the drawing, a second touch insulation layer TS-IL2 for covering the second conductive patterns is disposed on the first touch insulation layer TS-IL1.

According to another exemplary embodiment of the inventive concept, the first conductive patterns may include the first touch electrodes TE1-1 to TE1-4 and the first touch signal lines SL1-1 to SL1-4. The second conductive patterns may include the second touch electrodes TE2-1 to TE2-5 and the second touch signal lines SL2-1 to SL2-5. At this point, the contact holes CH are not defined in the first touch insulation layer TS-IL1.

Additionally, according to an exemplary embodiment of the inventive concept, the first conductive patterns and the second conductive patterns may be interchanged. That is, the second conductive patterns may include the bridge patterns CP2.

Additionally, according to an exemplary embodiment of the inventive concept, the first conductive patterns may further include dummy signal lines corresponding to the first touch signal lines SL1-1 to SL1-4 and the second touch signal lines SL2-1 to SL2-5. The dummy signal lines and the touch signal lines corresponding to each other may be connected to each other through the contact holes CH penetrating the first touch insulation layer TS-IL1 The dummy signal line lowers the resistance of a touch signal line.

Figure 8F:
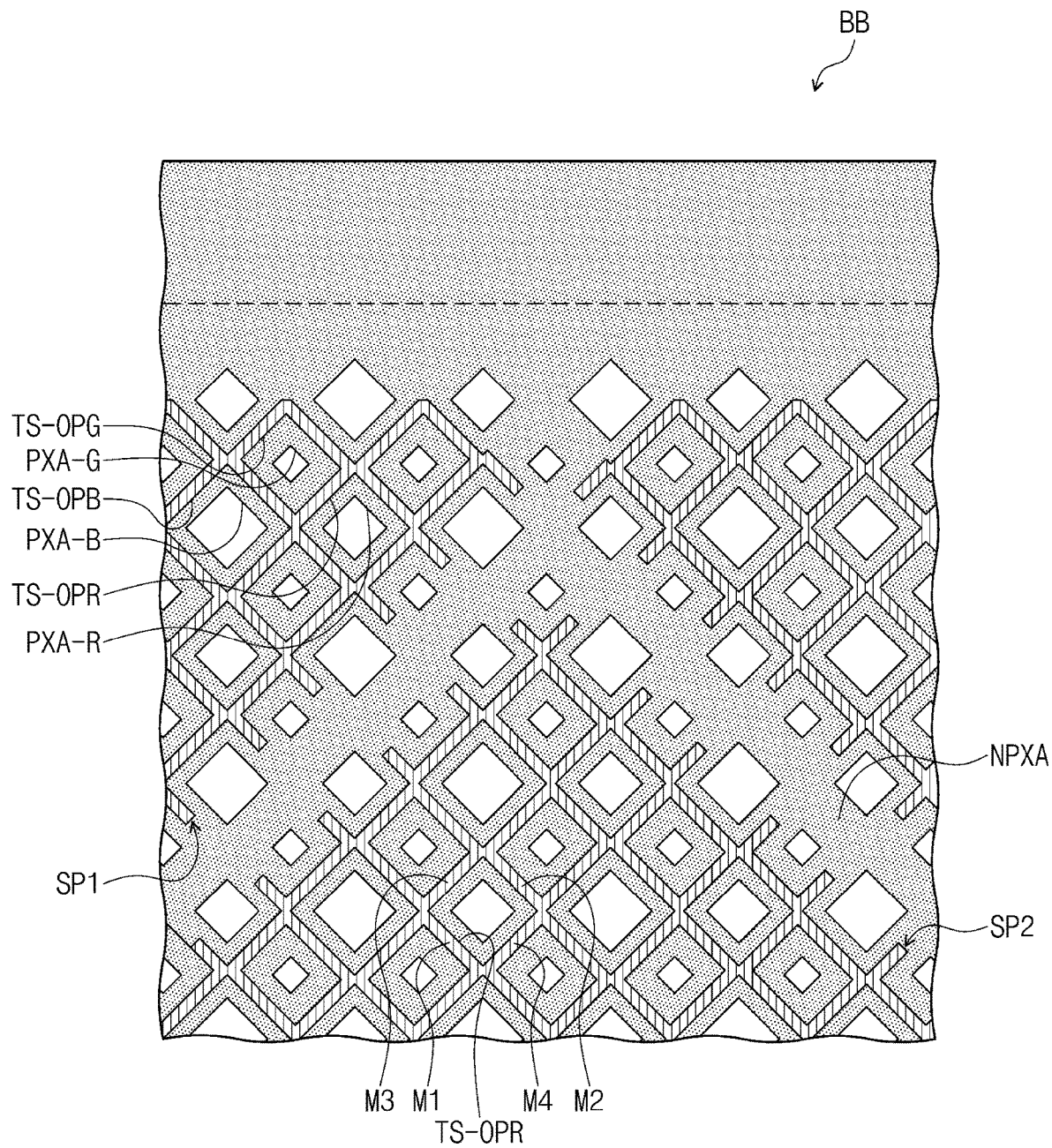

FIG. 8F is a partially enlarged view of an area BB of FIG. 8E. As shown in FIG. 8F, a first touch sensor part SP1 and a second touch sensor part SP2 overlap a non-light emitting area NPXA. A plurality of mesh holes TS-OPR, TS-OPG, and TS-OPB are defined in the first touch sensor part SP1 and the second touch sensor part SP2. The plurality of mesh holes TS-OPR, TS-OPG, and TS-OPB may have a one-to-one correspondence with the light emitting areas PXA-R, PXA-G, and PXA-B.

The light emitting areas PXA-R, PXA-G, and PXA-B may be defined like the light emitting area PXA of FIG. 6C. Organic light emitting diodes OLED are disposed in each of the light emitting areas PXA-R, PXA-G, and PXA-B. The organic light emitting diodes OLED may include first organic light emitting diodes for generating first color light, second organic light emitting diodes for generating second color light, and third organic light emitting diodes for generating third color light.

The light emitting areas PXA-R, PXA-G, and PXA-B may have different areas according to colors emitted from the light emitting layer EML (see FIG. 6C) of the organic light emitting diode OLED (see FIG. 6C). The sizes of the light emitting areas PXA-R, PXA-G, and PXA-B may be determined according to the type of an organic light emitting diode. The light emitting areas PXA-R, PXA-G, and PXA-B may be classified into at least two groups. FIG. 8F shows the light emitting areas PXA-R, PXA-G, and PXA-B classified into three groups.

The plurality of mesh holes TS-OPR, TS-OPG, and TS-OPB may be classified into several groups having different areas. They may be classified into at least two groups. FIG. 8F exemplarily shows the first mesh holes TS-OPR of a first area, the second mesh holes TS-OPG of a second area different from the first area, and the third mesh holes TS-OPG of a third area different from the first area and the second area. The areas of the mesh holes TS-OPR, TS-OPG, and TS-OPB may be determined according to a type of an organic light emitting diode OLED overlapping the same.

Each of the first touch sensor part SP1 and the second touch sensor part SP2 may include mesh lines for defining the plurality of mesh holes TS-OPR, TS-OPG, and TS-OPB. The mesh lines may include first mesh lines extending in a fourth direction DR4 intersecting the first direction DR1 and the second direction DR2 and second mesh lines extending in a fifth direction DR5 intersecting the fourth direction DR4. The line width of the first and second mesh lines may be several micro meters.

FIG. 8F separately shows four mesh line units M1, M2, M3, and M4 for defining one mesh hole TS-OPR. The mesh line units form part of the first mesh lines and the second mesh lines. The first mesh line unit M1 and the second mesh unit M2 face each other in the fourth direction DR4 and the third mesh line unit M3 and the fourth mesh line unit M4 face each other in the fifth direction DR5.

Although it is shown above that the mesh holes TS-OPR, TS-OPG, and TS-OPB correspond to the light emitting areas PXA-R, PXA-G, and PXA-B on a one-to-one basis, the inventive concept is not limited thereto. One of the mesh holes TS-OPR, TS-OPG, and TS-OPB may correspond to two or more of the light emitting areas PXA-R, PXA-G, and PXA-B.

Although it is shown that the sizes of the light emitting areas PXA-R, PXA-G, and PXA-B are various, the inventive concept is not limited thereto. The sizes of the light emitting areas PXA-R, PXA-G, and PXA-B may be identical to each other and the sizes of the mesh holes TS-OPR, TS-OPG, and TS-OPB may be identical to each other.

Figure 9A:
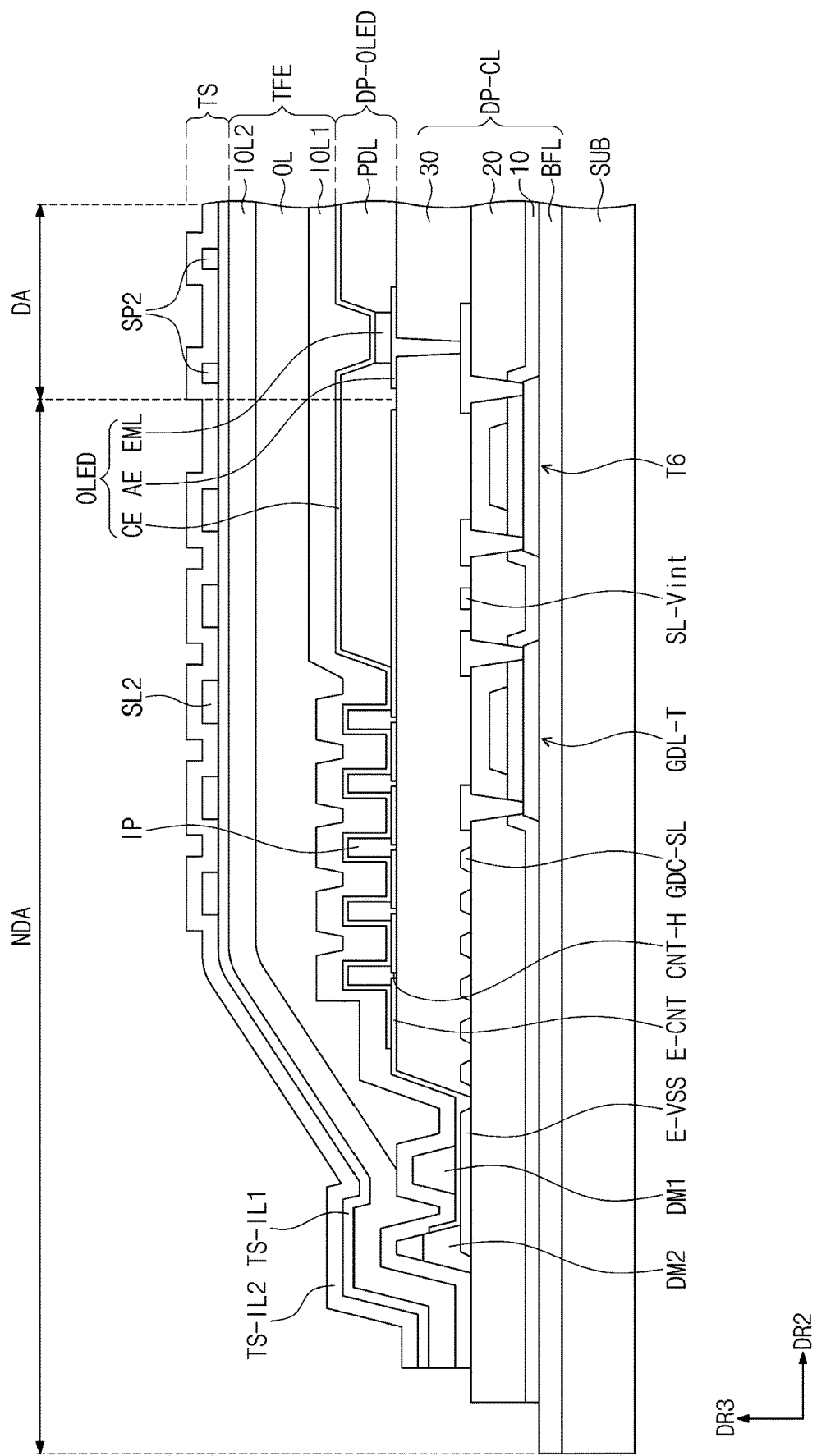
FIG. 9A is a sectional view of a display module according to an exemplary embodiment of the inventive concept.
Figure 9B:
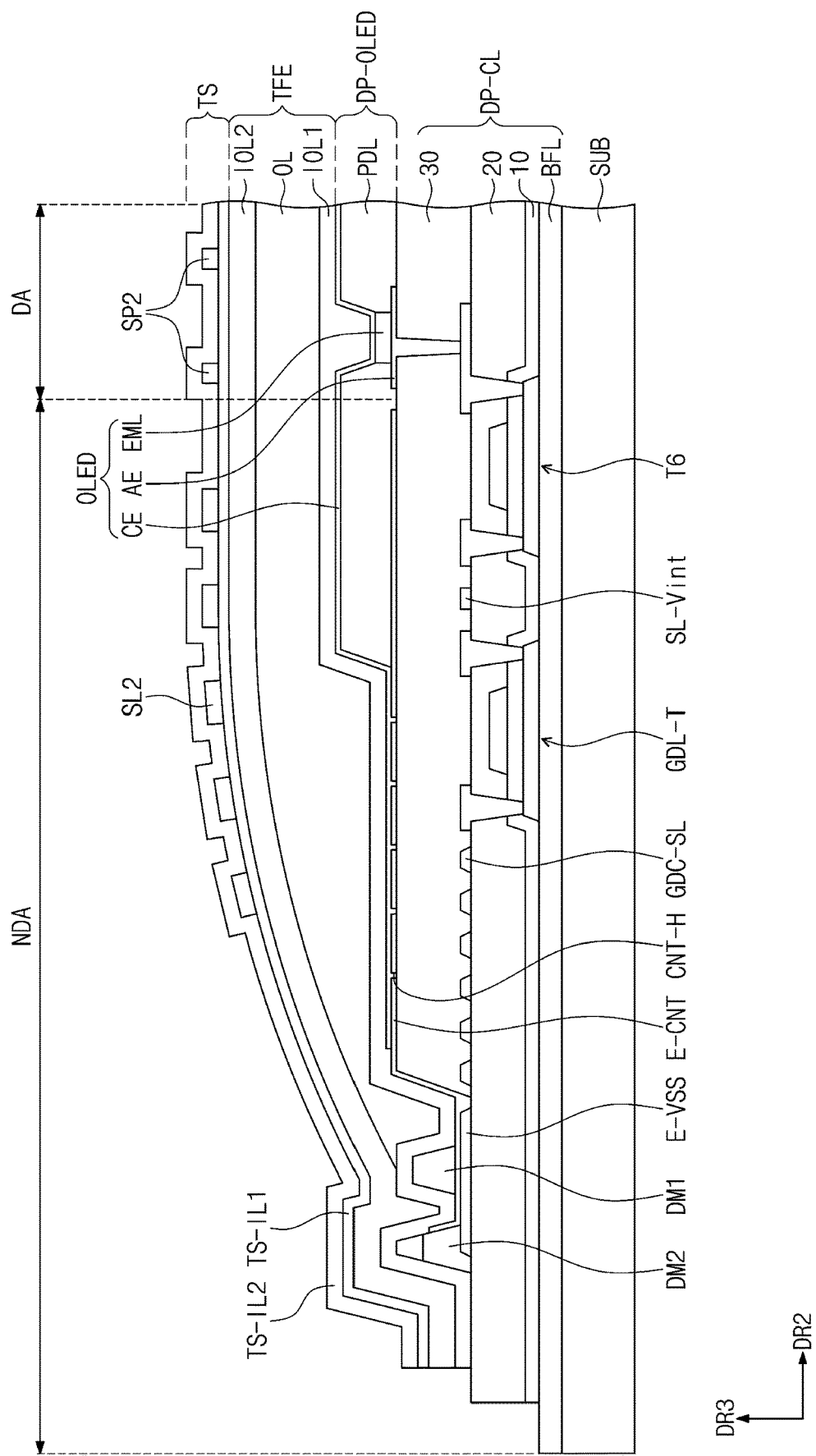
FIG. 9B is a section view of a display module according to a comparative example.
Figure 10:
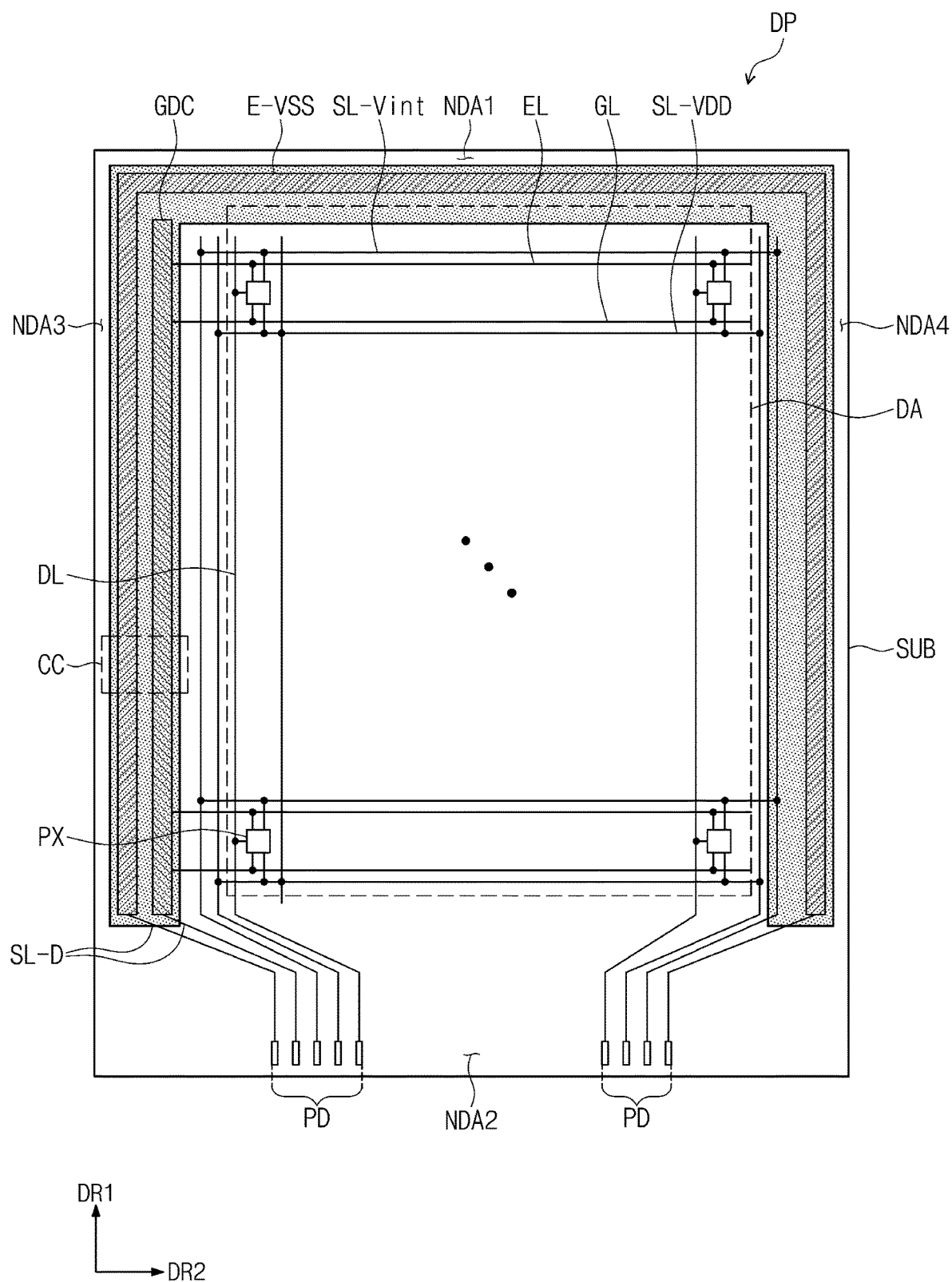
FIG. 10 is a plan view of a display module according to an exemplary embodiment of the inventive concept.

FIG. 9A is a sectional view of a display module DM according to an exemplary embodiment of the inventive concept. FIG. 9B is a section view of a display module according to a comparative example. FIGS. 9A and 9B show an enlarged area AA of FIG. 5A. FIG. 10 is a plan view of a display module DM according to an exemplary embodiment of the inventive concept.

Since a layer stacked structure of the circuit layer DP-CL, the light emitting device layer DP-OLED, and the thin film encapsulation layer TFE disposed in the display area DA is identical to the layer stacked structure described with reference to FIGS. 6B and 6C, detailed description is omitted. However, the hole control layer HCL and the electronic control layer ECL are not shown. Since a layer stacked structure of the touch sensing unit TS disposed in the display area DA is also identical to the configuration described with reference to FIGS. 8A to 8F, a detailed description thereof is omitted. The thin film layer TFE including the first inorganic layer IOL1, the organic layer OL, and the second inorganic layer IOL2 is shown in an exemplary embodiment. Hereinafter, the non-display area NDA is mainly described.

The scan driving circuit GDC of the circuit layer DP-CL is disposed in the non-display area NDA. The scan driving circuit GDC includes at least one transistor GDC-T formed through the same process as the pixel transistor T6. The scan driving circuit GDC includes signal lines GDC-SL disposed on the same layer as the input electrode of the pixel transistor T6. The initialization voltage line SL-Vint and the power supply electrode E-VSS also are disposed on the same layer as the input electrode of the pixel transistor T6. Since the initialization voltage line SL-Vint, the power supply electrode E-VSS, and the input electrode of the pixel transistor T6 also are formed through the same process, they may include the same layer structure and the same material.

As shown in FIG. 10, the power supply electrode E-VSS is disposed outside the scan driving circuit GDC. The power supply electrode E-VSS may extend along the outline of the base layer SUB. A non-display area may include a first non-display area NDA1 and a second non-display area NDA2 facing each other in the first direction DR1 with the display area DA therebetween. The non-display area may include a third non-display area NDA3 and a fourth non-display area NDA4 facing each other in the second direction DR2 with the display area DA therebetween. The power supply electrode E-VSS may be disposed in at least one non-display area among the first non-display area NDA1, the third non-display area NDA3, and the fourth non-display area NDA4. The power supply electrode E-VSS may be disposed in the first non-display area NDA1, the third non-display area NDA3, and the fourth non-display area NDA4.

Referring to FIG. 9A again, the connection electrode E-CNT is disposed on the third insulation layer 30. The connection electrode E-CNT connects the power supply electrode E-VSS and the second electrode CE. The connection electrode E-CNT delivers a second power supply voltage from the power supply electrode E-VSS to the second electrode CE. Since the connection electrode E-CNT is formed through the same process as the first electrode AE, it may include the same layer structure and the same material. The connection electrode E-CNT and the first electrode AE may have the same thickness.

The connection electrode E-CNT may be disposed in at least one non-display area among the first non-display area NDA1, the third non-display area NDA3, and the fourth non-display area NDA4. The connection electrode E-CNT may be disposed in the first non-display area NDA1, the third non-display area NDA3, and the fourth non-display area NDA4.

A plurality of holes CNT-H are defined in the connection electrode E-CNT. The plurality of holes CNT-H discharge gases generated during a process for forming the third insulation layer. A plurality of insulation patterns IP overlapping the plurality of holes CNT-H are disposed on the connection electrode E-CNT. The plurality of insulation patterns IP may one-to-one correspond to the plurality of holes CNT-H.

The plurality of insulation patterns IP may be a single layer and may be formed with the pixel definition layer PDL at the same time. Since the plurality of insulation patterns IP are formed with the pixel definition layer PDL through the same process, they may have the same thickness and include the same material. The plurality of insulation patterns IP may have a smaller thickness than the pixel definition layer PDL.

The second electrode CE overlaps at least part of the plurality of insulation patterns IP. The second electrode CE contacts a non-overlapping part of the plurality of insulation patterns IP of the connection electrode E-CNT.

As shown in FIG. 9A, dams DM1 and DM2 may be disposed in the non-display area NDA. According to this exemplary embodiment, the first dam DM1 and the second dam DM2 spaced in the second direction DR2 are shown. Although not separately shown in the drawing, the first dam DM1 and the second dam DM2 may be disposed surrounding the display area DA on a plane. The first dam DM1 and the second dam DM2 may be disposed in the first non-display area NDA1, the third non-display area NDA3, and the fourth non-display area NDA4.

The first dam DM1 may be disposed on the power supply electrode E-VSS. The first dam DM1 may be a single layer and may be formed with the pixel definition layer PDL at the same time. Since the first dam DM1 is formed through the same process as the pixel definition layer PDL, they may have the same thickness and include the same material. The first dam DM1 may have a smaller thickness than the pixel definition layer PDL.

The second dam DM2 may be disposed outside the first dam DM1. For example, a distance between the second dam DM2 and the display area DA may be greater than a distance between the first dam DM1 and the display area DA.

The second dam DM2 may cover a part of the power supply electrode E-VSS. The second dam DM2 may have a multilayer structure. A lower part may be formed with the third insulation layer 30 at the same time and an upper part may be formed with the pixel definition layer PDL at the same time.

The first inorganic layer IOL1 may cover the first dam DM1 and the second dam DM2. An edge of the first inorganic layer IOL1 may contact the second insulation layer 20. The organic layer OL may overlap the insulation patterns IP and its edge overlaps the first dam DM1 and the second dam DM2. It is desired that an edge of the organic layer OL is not disposed outside the second dam DM2. The second inorganic layer IOL2 may overlap the first dam DM1 and the second dam DM2. An edge of the second inorganic layer IOL2 may contact the first inorganic layer IOL1.

The first touch insulation layer TS-IL1 may overlap the first dam DM1 and the second dam DM2. An edge of the first touch insulation layer TS-IL1 may contact the second inorganic layer IOL2.

At least part of the touch signal lines SL2 disposed on the first touch insulation layer TS-IL1 overlaps the plurality of insulation patterns IP. It is not necessary that the entire touch signal lines SL2 overlap the plurality of insulation patterns IP and it is sufficient that a part of some touch signal lines SL2 overlaps the insulation patterns IP.

As shown in FIG. 9A, the touch signal lines SL2 of the touch sensing unit TS according to this exemplary embodiment are disposed on a relatively flat surface. According to the comparative example shown in FIG. 9B, some touch signal lines SL2 are disposed on an inclined surface. According to the comparative example, since the insulation pattern IP shown in FIG. 9A is omitted, a thickness of the organic layer OL is gradually reduced as it goes toward an edge of the base layer SUB. When comparing lengths according to the second direction DR2 of an area where the thicknesses of the organic layers OL of this exemplary embodiment and the comparative example are reduced, it is known that the length of the comparative example is greater than the length of this exemplary embodiment. This will be described in detail below with reference to FIG. 11B and FIG. 11C.

When a distance to the second electrode CE is changed according to the position of the touch signal lines SL2 (see FIG. 9B), noise is generated. Especially, as a capacitance of the touch signal line SL2 and the second electrode CE is increased at the outermost, noise may be increased only at a specific signal line. Additionally, noise by the signal lines GDC-SL of the scan driving circuit GDC may concentrate on the outermost touch signal line SL2. The noise may be amplified by a signal line where AC signal is applied among the signal lines GDC-SL of the scan driving circuit GDC.

Figure 11A:
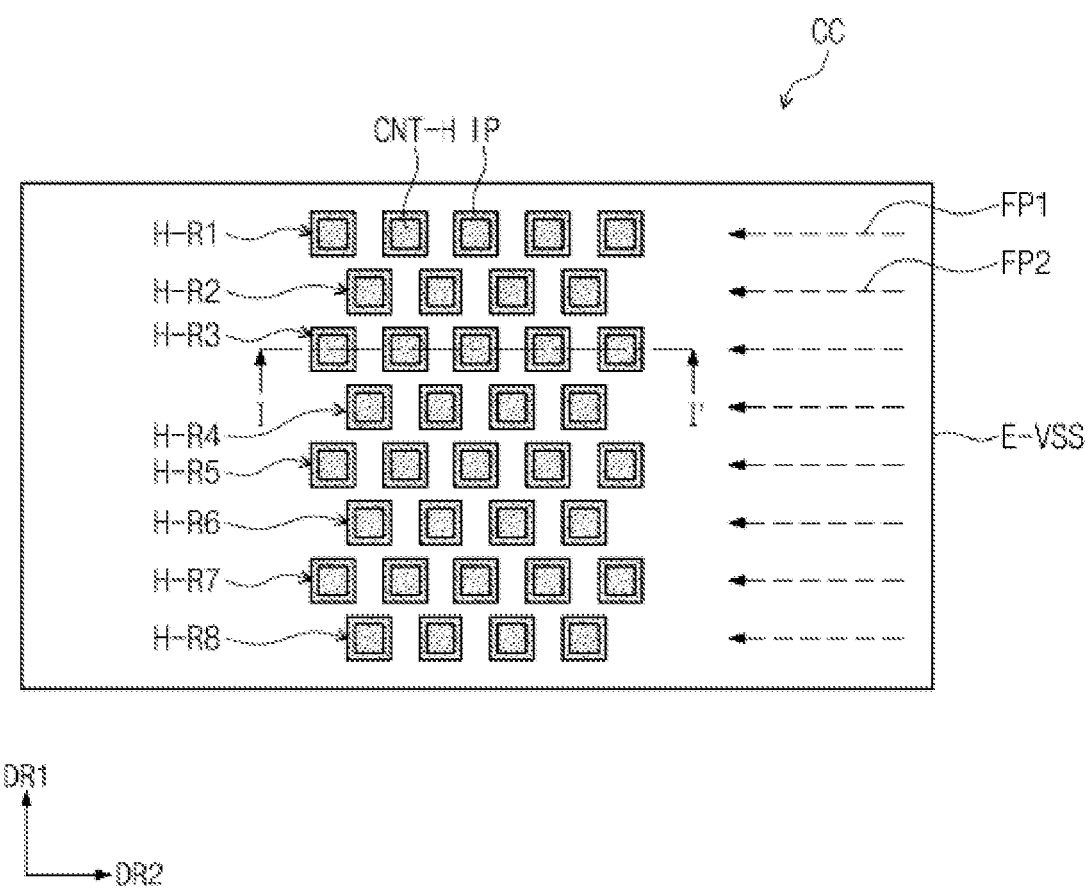
FIG. 11A is an enlarged plan view of a part of a display module according to an exemplary embodiment of the inventive concept.
Figure 11B:
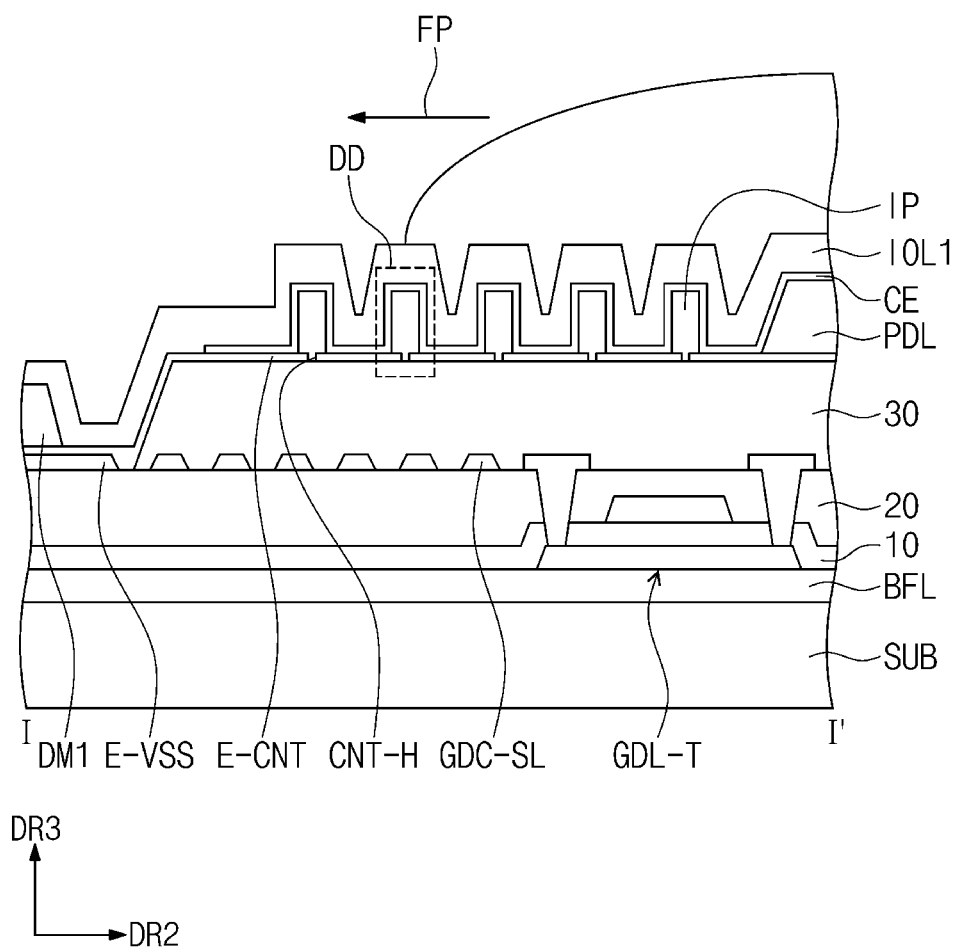
FIG. 11B is a sectional view of a display module taken along a line I-I' of FIG. 11A according to an exemplary embodiment of the inventive concept.
Figure 11C:
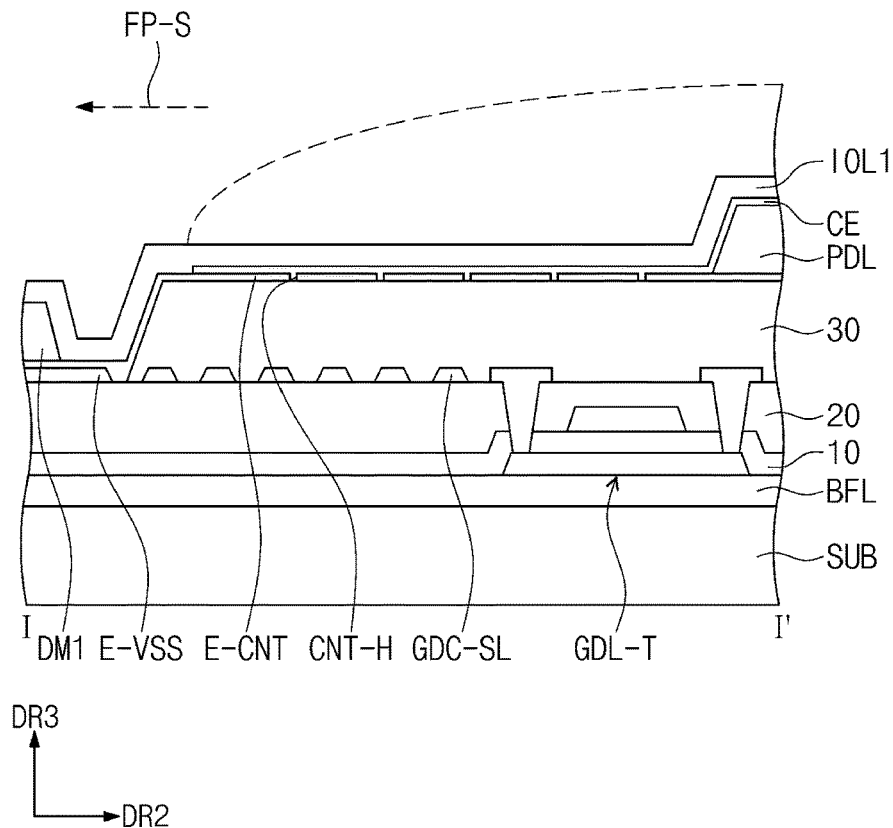
FIG. 11C is a sectional view of a display module taken along a line I-I' of FIG. 11A according to a comparative example of the inventive concept.
Figure 11D:
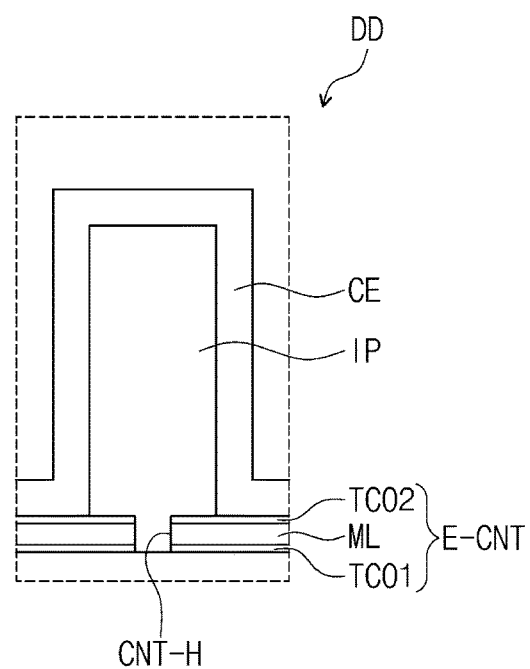
FIG. 11D is an enlarged sectional view of a part of FIG. 11B.

FIG. 11A is an enlarged plan view of a part of a display module according to an exemplary embodiment of the inventive concept. FIG. 11B is a sectional view of a display module taken along a line I-I' of FIG. 11A according to an exemplary embodiment of the inventive concept. FIG. 11C is a sectional view of a display module taken along a line I-I' of FIG. 11A according to a comparative example of the inventive concept. FIG. 11D is an enlarged sectional view of a part of FIG. 11B. FIG. 11A corresponds to an area CC of FIG. 10. FIGS. 11B and 11C illustrate forming a thin film encapsulation layer.

As shown in FIG. 11A, the plurality of insulation patterns IP may one-to-one correspond to the plurality of holes CNT-H. The plurality of holes CNT-H define a plurality of rows H-R1 to H-R8, and the plurality of rows H-R1 to H-R8 are arranged in the first direction DR1. The plurality of rows H-R1 to H-R8 may include holes arranged in the second direction DR2, and the plurality of rows H-R1 to H-R8 may include a different number of holes. A form on the plane of the plurality of holes CNT-H is not limited.

Holes of the first row H-R1 among a plurality of rows may be defined as first holes and holes of the second row H-R2 among a plurality of rows may be defined as second holes. Holes of the third row H-R3 among a plurality of rows may be defined as third holes.

The first row H-R1 and the third row H-R3 may include the same number of holes. The first holes and the third holes may be aligned. The second holes are disposed between the first holes.

The plurality of insulation patterns IP may have the same arrangement as the plurality of holes CNT-H. The plurality of insulation patterns IP may control the flow of a liquid organic material.

As shown in FIG. 11B, a liquid organic material is provided on the first inorganic layer IOL1 in order to from the organic layer OL (see FIG. 9A). The liquid organic material may be provided from an inkjet head. A liquid organic material provided to an edge portion of the display area DA (see FIG. 9A) flows to the non-display area NDA. The plurality of insulation patterns IP may control the flow of the liquid organic material. The first dam DM1 and the second dam DM2 may prevent the liquid organic material from overflowing. Although not separately shown in the drawing, in order to control the flow rate/flow velocity of the liquid organic material, hydrophobic or hydrophilic plasma treatment may be performed on the first inorganic layer IOL1.

FIGS. 11B and 11C show two paths FP and FP-S, respectively. FIG. 11B shows a path according to this exemplary embodiment and FIG. 11C shows a path according to a comparative example. Referring to the path FP according to this exemplary embodiment, the plurality of insulation patterns IP reduce the flow velocity of a liquid organic material. The liquid organic material slowly flows toward an edge of the base layer SUB. Additionally, since the plurality of insulation patterns IP compensate for a thickness, the organic layer OL (see FIG. 9A) relatively has a uniform thickness in the non-display area NDA (see FIG. 9A).

According to the path FP-S of the comparative example shown in FIG. 11C, since the flow velocity is not reduced, the thickness of the organic layer OL (see FIG. 9B) becomes lower as it goes toward an edge of the base layer SUB. Accordingly, the organic layer OL (see FIG. 9B) has a non-uniform thickness in the non-display area NDA (see FIG. 9A).

According to the path FP, as the flow rate/flow velocity of a liquid crystal organic material is controlled, a uniform and flat organic layer may be formed in the non-display area NDA. As shown in FIG. 11A, as the insulation patterns IP of an even row between odd rows become, they may control all of paths FP1 (hereinafter referred to as first paths) corresponding to an odd row and paths FP2 (hereinafter referred to as second paths) corresponding to an even row.

The insulation patterns IP may control the flow rate/flow velocity of a liquid organic material, and also prevent a damage of the connection electrode E-CNT. As shown in FIG. 11D, the connection electrode E-CNT may include a first transparent conductive layer TCO1, a metal layer ML on the first transparent conductive layer TCO1, and a second transparent conductive layer TCO2 on the metal layer ML. The first transparent conductive layer TCO1 and the second transparent conductive layer TCO2 may include indium tin oxide (ITO), indium zinc oxide (IZO), zinc oxide (ZnO), or indium tin zinc oxide (ITZO). The metal layer ML may include a highly conductive metal, such as aluminum, copper, and silver.

The insulation patterns IP may cover a sectional surface of the metal layer ML exposed by the plurality of holes CNT-H. Accordingly, corrosion of the metal layer ML is prevented.

Figure 12A:
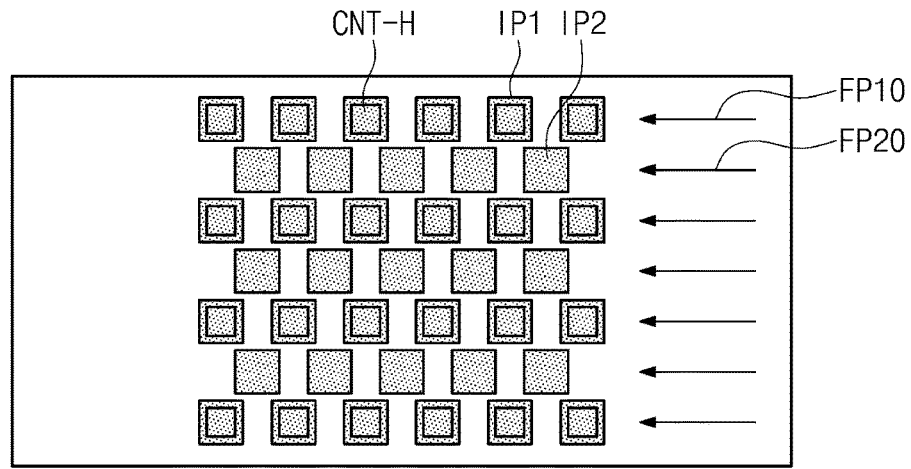
FIG. 12A, FIG. 12B, and FIG. 12C are enlarged plan views of a part of a display module according to an exemplary embodiment of the inventive concept.
Figure 12B:
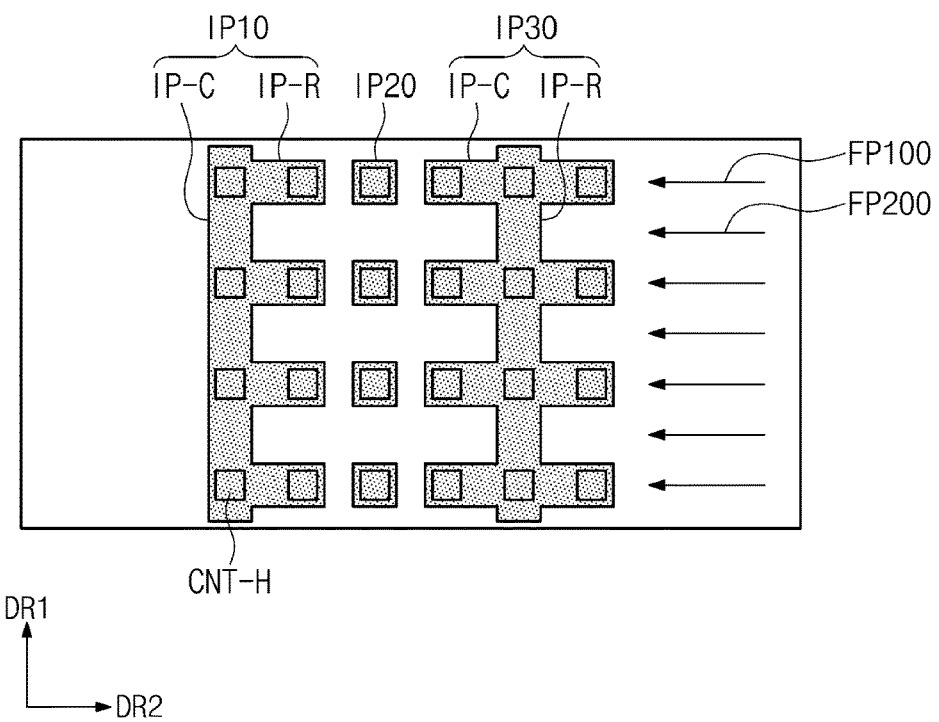
Figure 12C:
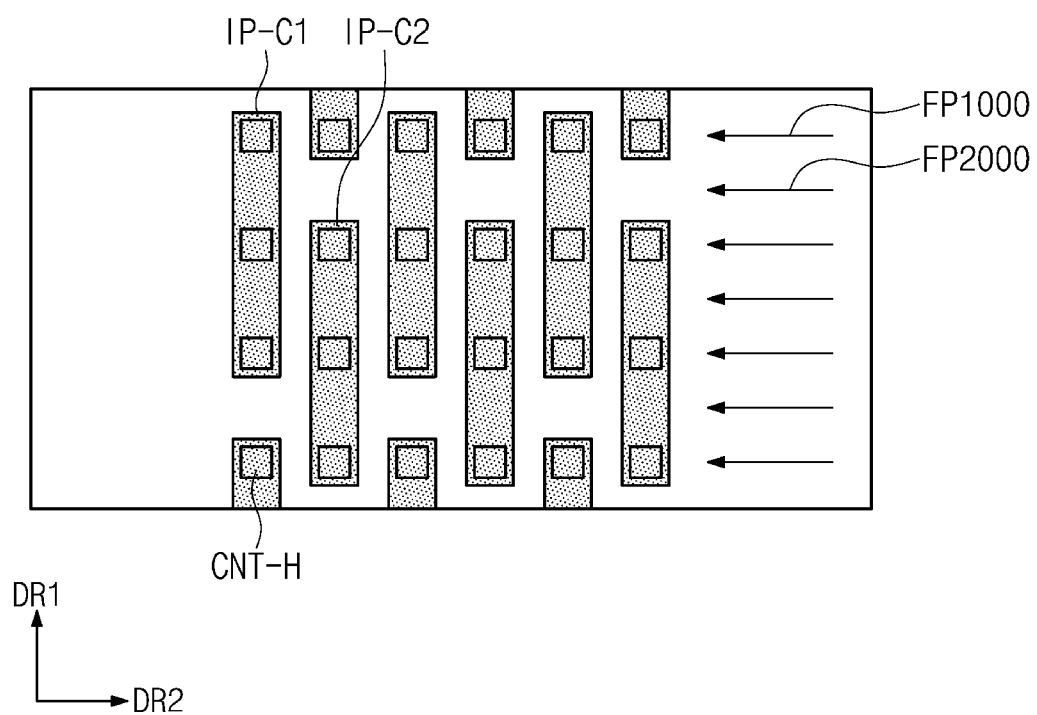

FIGS. 12A to 12C are enlarged plan views of a part of a display module according to an exemplary embodiment of the inventive concept. FIGS. 12A to 12C are plan views corresponding to FIG. 11A. Hereinafter, detailed description for the same configuration described with reference to FIGS. 11A to 11D is omitted.

As shown in FIG. 12A, the plurality of holes CNT-H may be arranged in an n×m matrix. Herein, n and m are natural numbers greater than or equal to two (2). The holes CNT-H in a 4×6 matrix are shown exemplarily. All holes defined in the connection electrode E-CNT are not necessarily arranged in a matrix, and holes defined in some areas may be arranged in a matrix. For example, holes CNT-H defined in other some areas may be arranged like FIG. 11A.

The insulation patterns may include first insulation patterns IP1 overlapping the plurality of holes CNT-H and second insulation patterns IP2 non-overlapping the plurality of holes CNT-H. The first insulation patterns IP1 may be arranged in an n×m matrix in a one-to-one correspondence with holes in a matrix.

The second insulation patterns IP2 are disposed spaced from the first insulation patterns IP1. The second insulation patterns IP2 may define n−1 rows between n rows of the first insulation patterns IP1 and m−1 columns between m columns of the first insulation patterns IP1. The second insulation patterns IP2 may be disposed at the centers of four first insulation patterns for defining the smallest rectangle among the first insulation patterns IP1.

The lengths of the second insulation patterns IP2 on a plane are greater than intervals between the second insulation patterns IP2 and the first insulation patterns IP1. For example, the lengths of the second insulation patterns IP2 may be two times greater than intervals between the second insulation patterns IP2 and the first insulation patterns IP1.

The first insulation patterns IP1 may control a path FP10 identical to the first paths FP1 shown in FIG. 11A and the second insulation patterns IP2 may control a path FP20 corresponding to the second paths FP2 shown in FIG. 11A.

As shown in FIG. 12B, insulation patterns may include first insulation patterns IP10 and second insulation patterns IP20 having different forms.

The first insulation patterns IP10 may include a column portion IP-C and a row portion IP-R connected to the column portion IP-C. The column portion IP-C may have a form that extends along an edge extending in the first direction DR1 of the base layer SUB (see FIG. 10). The second insulation patterns IP20 may have a form corresponding to the holes CNT-H. The insulation patterns may include the column portion IP-C and the row portion IP-R and may further include third insulation patterns IP30 having a different form than the first insulation patterns IP10.

The row portion IP-R of the first insulation patterns IP10 and the second insulation patterns IP20 may control a path FP100 identical to the first paths FP1 shown in FIG. 11A, and the column portion IP-C of the first insulation patterns IP10 may control a path FP200 corresponding to the second paths FP2 shown in FIG. 11A.

Although the plurality of holes CNT-H arranged in an n×m matrix are shown in FIG. 12B, the inventive concept is not limited thereto. For example, holes CNT-H defined in other some areas may be arranged like FIG. 11A.

As shown in FIG. 12C, the insulation patterns may include column insulation patterns IP-C1 and IP-C2 that overlap some holes arranged in a column direction among the holes CNT-H arrange in an n×m matrix.

The first column insulation pattern IP-C1 and the second column insulation pattern IP-C2 overlap holes of adjacent and different rows. As seen from the second direction DR2, the first column insulation pattern IP-C1 and the second column insulation pattern IP-C2 overlap each other. When shifting the second column insulation pattern IP-C2 toward the first column insulation pattern IP-C1 in the second direction DR2, the second column insulation pattern IP-C2 part overlaps. The first column insulation pattern IP-C1 and the second column insulation pattern IP-C2 are disposed alternately and ends of the second column insulation patterns IP-C2 may overlap the center area of the first column insulation patterns IP-C1. Herein, the boundary of the center area may be defined on the inner 10% of the length of the first column insulation patterns IP-C1 from ends of the first column insulation patterns IP-C1.

The first column insulation pattern IP-C1 and the second column insulation pattern IP-C2 complementarily control a path FP1000 identical to the first paths FP1 and a path FP2000 corresponding to the second paths FP2, shown in FIG. 11A.

Figure 13A:
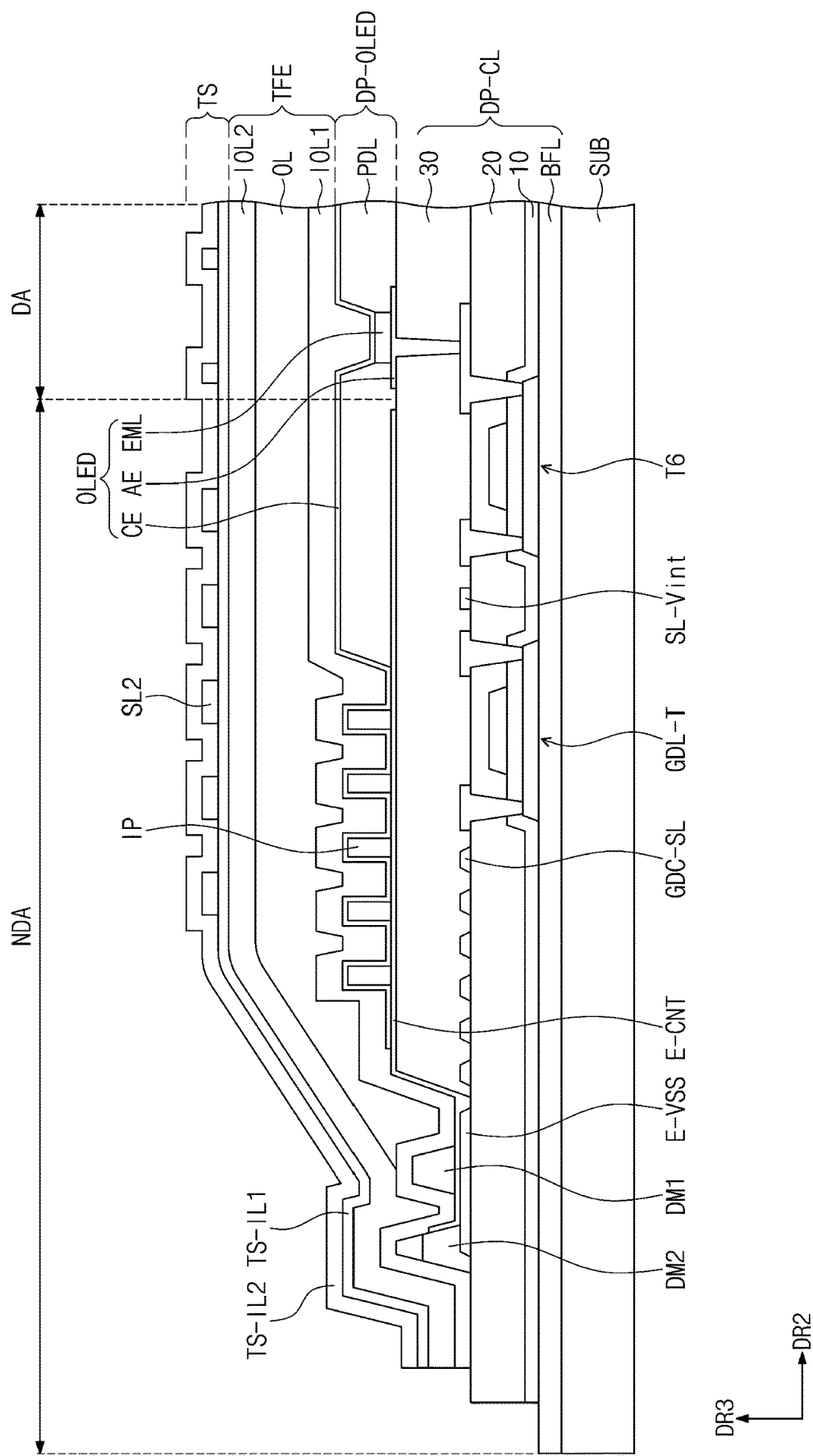
FIG. 13A and FIG. 13B are sectional views of a display module according to an exemplary embodiment of the inventive concept.
Figure 13B:
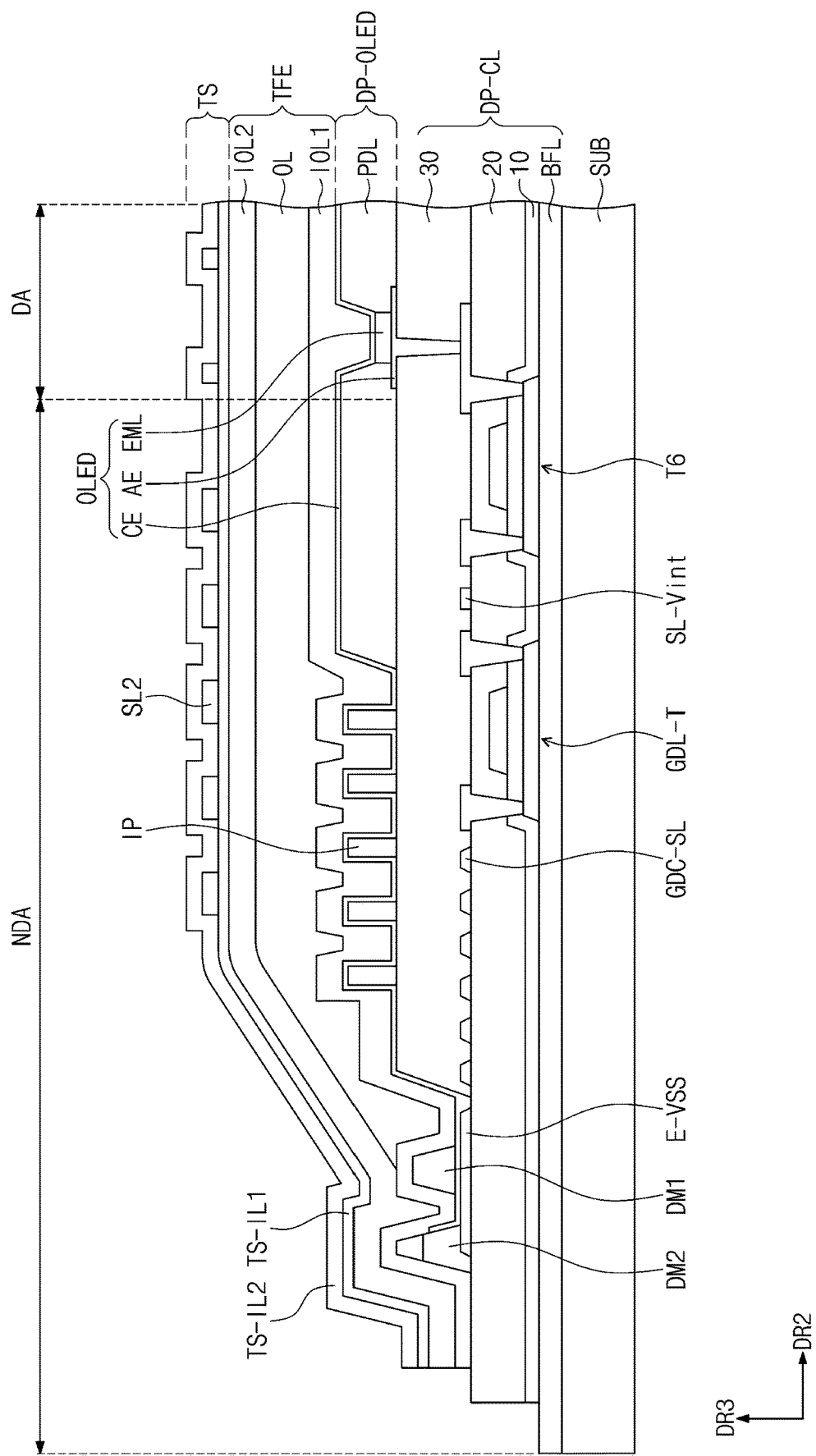

FIGS. 13A and 13B are sectional views of a display module according to an exemplary embodiment of the inventive concept. FIGS. 13A and 13B show a section corresponding to FIG. 9A. Hereinafter, a detailed description for the same configuration described with reference to FIGS. 9A to 12C is omitted.

As shown in FIG. 13A, the holes CNT-H defined in the connection electrode E-CNT may be omitted. That is, the connection electrode E-CNT does not include the holes CNT-H. Regardless of the holes CNT-H, the insulation patterns IP may be disposed on the connection electrode E-CNT. The insulation patterns IP may have the arrangement and the form shown in FIG. 11A and FIGS. 12A to 12C on a plane.

As shown in FIG. 13B, the connection electrode E-CNT may be omitted. The insulation patterns IP may be directly disposed on the third insulation layer 30. The insulation patterns IP may have the arrangement and the form shown in FIG. 11A and FIGS. 12A to 12C on a plane.

As mentioned above, insulation patterns may control the flow of a monomer solution constituting a thin film encapsulation layer. A flat organic layer may be formed to an edge area by controlling a flow rate that flows to an edge area of a display panel of a monomer solution. As a result, an inorganic layer disposed on the organic layer may also provide a flat upper surface. Touch signal lines disposed on the inorganic layer are spaced the substantially same distance from a second electrode. Additionally, the separation distance may be greater than a reference distance. Signal interference between the second electrode and the touch signal lines may be prevented.

Although exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A display device comprising:
   a base layer comprising a display area and a non-display area;
   a circuit layer comprising at least one intermediate insulation layer and a power supply electrode overlapping the non-display area, the circuit layer disposed on the base layer;
   a light emitting device layer comprising:
     an organic light emitting diode comprising a first electrode disposed on the circuit layer, a light emitting layer, and a second electrode;
     a pixel definition layer comprising an opening for exposing the first electrode;
     a connection electrode connecting the second electrode and the power supply electrode, the connection electrode comprising a plurality of holes; and
     a plurality of insulation patterns overlapping the holes;
   a thin film encapsulation layer comprising an organic layer overlapping the plurality of insulation patterns and the organic light emitting diode, the thin film encapsulation layer disposed on the light emitting device layer; and
   a touch sensing unit comprising at least one touch insulation layer, a plurality of touch electrodes, and a plurality of touch signal lines connected to the plurality of touch electrodes, the touch sensing unit disposed on the thin film encapsulation layer,
   wherein:
   at least a portion of the plurality of touch signal lines overlaps the plurality of insulation patterns;
   the plurality of holes are arranged in an n×m matrix;
   the plurality of insulation patterns comprise a first insulation pattern comprising a column portion and a row portion connected to the column portion; and
   the row portion overlaps holes arranged in a column direction among the holes in the n×m matrix, and the row portion overlaps a hole disposed in a row direction of the holes arranged in the column direction.

2. The display device of claim 1, wherein the plurality of insulation patterns further comprise:
   a second insulation pattern;
   a plurality of the first insulation patterns; and
   the second insulation pattern disposed between two first insulation patterns spaced in the row direction.

3. A display device comprising:
   a base layer comprising a display area and a non-display area;
   a circuit layer disposed on the base layer;
   a light emitting device layer comprising a light emitting diode disposed on the circuit layer, a pixel definition layer comprising an opening for exposing a first electrode of the light emitting diode, and a plurality of insulation patterns overlapping the non-display area;
   an organic layer disposed on the light emitting device layer and overlapping the plurality of insulation patterns and the light emitting diode; and
   a touch sensing unit comprising a plurality of touch electrodes and a plurality of touch signal lines connected to the plurality of touch electrodes, the touch sensing unit disposed on the organic layer,
   wherein:
   at least a portion of the plurality of touch signal lines overlaps the plurality of insulation patterns; and
   the plurality of insulation patterns comprise first insulation patterns comprising a column portion extending along an edge of the base layer and a row portion connected to the column portion.

4. The display device of claim 3, wherein the plurality of insulation patterns further comprise second insulation patterns disposed between two first insulation patterns spaced apart from each other.

* * * * *